(12) United States Patent
Park et al.

(10) Patent No.: US 11,587,990 B2
(45) Date of Patent: Feb. 21, 2023

(54) DISPLAY DEVICE AND TOUCH INPUT SYSTEM INCLUDING THE SAME

(71) Applicant: SAMSUNG DISPLAY CO., LTD., Yongin-si (KR)

(72) Inventors: Won Sang Park, Yongin-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/666,749

(22) Filed: Feb. 8, 2022

(65) Prior Publication Data

US 2022/0392962 A1 Dec. 8, 2022

(30) Foreign Application Priority Data

Jun. 8, 2021 (KR) ........................ 10-2021-0074281

(51) Int. Cl.
| | |
|---|---|
| *H01L 27/32* | (2006.01) |
| *H01L 51/52* | (2006.01) |
| *G06F 3/041* | (2006.01) |
| *G06F 3/044* | (2006.01) |

(52) U.S. Cl.
CPC .......... *H01L 27/323* (2013.01); *G06F 3/0412* (2013.01); *G06F 3/0446* (2019.05); *H01L 51/5293* (2013.01); *G06F 2203/04112* (2013.01)

(58) Field of Classification Search
CPC .......................... G06F 3/0446; G06F 3/03545
See application file for complete search history.

(56) References Cited

U.S. PATENT DOCUMENTS

| | | | | |
|---|---|---|---|---|
| 2005/0145703 | A1* | 7/2005 | Bryborn | G06K 19/06037 235/494 |
| 2007/0023523 | A1* | 2/2007 | Onishi | G06F 3/0321 235/494 |
| 2008/0101702 | A1* | 5/2008 | Sonoda | G06F 3/03545 382/188 |
| 2008/0297489 | A1* | 12/2008 | Funo | G06F 3/041 345/175 |
| 2020/0333953 | A1* | 10/2020 | Lee | G06F 3/005 |

FOREIGN PATENT DOCUMENTS

| | | |
|---|---|---|
| CN | 109461831 | 9/2020 |
| KR | 10-1387005 | 4/2014 |
| KR | 10-1431686 | 8/2014 |
| KR | 10-1839929 | 3/2018 |

* cited by examiner

*Primary Examiner* — Robin J Mishler
(74) *Attorney, Agent, or Firm* — F. Chau & Associates, LLC

(57) ABSTRACT

A display device includes a display unit comprising a plurality of light-emitting areas emitting light. A touch sensing unit is disposed on the display unit to sense a touch. A buffer part is disposed on the touch sensing unit to cushion an external impact. A metal pattern is disposed on the buffer part and has a mesh structure. The metal pattern includes a plurality of code patterns having a cut shape that encodes position information.

14 Claims, 18 Drawing Sheets

FIG. 10

| | Col1 | Col2 | Col3 | Col4 | Col5 | Col6 | |
|---|---|---|---|---|---|---|---|
| Row1 | 00 | 01 | 01 | 11 | 10 | 11 | |
| Row2 | 00 | 01 | Null | 10 | 00 | 10 | |
| Row3 | 01 | 01 | 01 | 01 | Null | 10 | |
| Row4 | 01 | 10 | 00 | 00 | 01 | 11 | |
| Row5 | 01 | 01 | 00 | 10 | 01 | 11 | |
| Row6 | 01 | 10 | 11 | 11 | 11 | 01 | |

MP: MP1, MP2

DISPLAY DEVICE AND TOUCH INPUT SYSTEM INCLUDING THE SAME

This application claims priority under 35 U.S.C. § 119 to Korean Patent Application No. 10-2021-0074281, filed on Jun. 8, 2021 in the Korean Intellectual Property Office, the disclosure of which is incorporated by reference in its entirety herein.

1. TECHNICAL FIELD

The present disclosure relates to a display device and a touch input system including the same.

2. DISCUSSION OF RELATED ART

Display devices for displaying images are being increasingly used in various forms as the information society develops. For example, display devices are being applied to various electronic devices, such as smartphones, digital cameras, notebook computers, navigation devices and smart televisions. The display devices may be flat panel display devices such as liquid crystal display devices, field emission display devices, and organic light emitting display devices. Among these flat panel display devices, a light emitting display device includes a light emitting element that enables each pixel of a display panel to be self-emitting. Therefore, the light emitting display device can display an image without a backlight unit that provides light to the display panel.

Display devices have been configured to sense a touch input from a user's body part (e.g., a finger) and a touch input using an electronic pen. A display device that senses a touch input using an electronic pen may sense a touch input more precisely than when sensing only a touch input from the user's body part.

SUMMARY

Aspects of the present disclosure provide a display device, which can be applied to all electronic devices without being limited by size by including a metal pattern having a plurality of code patterns disposed on a buffer part, an adhesive part or a cover member and can reduce deterioration of image quality of a touch input system, and the touch input system including the display device.

Aspects of the present disclosure also provide a display device, which can reduce cost, reduce power consumption and simplify a driving process by generating touch coordinate data of a touch input device without complicated calculation and correction when a touch input is performed on the display device using the touch input device, and a touch input system including the display device.

However, aspects of the present disclosure are not restricted to the ones set forth herein. The above and other aspects of embodiments of the present disclosure will become more apparent to one of ordinary skill in the art to which the present disclosure pertains by referencing the detailed description of the present disclosure given below.

According to an embodiment of the disclosure, a display device includes a display unit comprising a plurality of light-emitting areas emitting light. A touch sensing unit is disposed on the display unit to sense a touch. A buffer part is disposed on the touch sensing unit to cushion an external impact. A metal pattern is disposed on the buffer part and has a mesh structure. The metal pattern includes a plurality of code patterns having a cut shape that encodes position information.

In an embodiment, the metal pattern may be floating by being electrically independent.

In an embodiment, the metal pattern may reduce scattering and absorption of visible light, infrared light and ultraviolet light and is identifiable using the visible light, the infrared light or the ultraviolet light.

In an embodiment, the metal pattern may be blackened to reduce reflection of external light.

In an embodiment, a line width of the metal pattern may be in a range of about 3 μm or less, and a pitch of the metal pattern may be in a range of about 500 μm or less.

In an embodiment, the metal pattern may comprise a first metal pattern extending in a first direction and a second metal pattern intersecting the first metal pattern. The first and second metal patterns have first and second angles therebetween. The first and second angles are adjacent to each other. The first angle is greater than the second angle.

In an embodiment, the metal pattern may comprise a single layer disposed on the buffer part.

In an embodiment, the metal pattern may further comprise a reference point serving as a basis for identification of the plurality of code patterns, a first reference line extending from the reference point in a first direction, and a second reference line extending from the reference point in a second direction intersecting the first direction. The plurality of code patterns may be disposed in an area defined by the first reference line and the second reference line.

In an embodiment, the reference point may comprise an area in which the metal pattern is absent at an intersection point of the metal pattern.

In an embodiment, the first reference line may be defined by connecting a plurality of adjacent intersection points disposed in the first direction of the reference point.

In an embodiment, the second reference line may be defined by connecting at least one plurality of adjacent intersection points disposed in the second direction of the reference point and at least one cut part disposed between the at least one adjacent intersection points.

In an embodiment, each of the plurality of code patterns may be provided by an absence of one stem among a plurality of stems extending from an intersection point of the metal pattern. A direction in which the one stem is absent may correspond to a value of a preset data code constituting the position information.

In an embodiment, the metal pattern comprises a first metal pattern and a second metal pattern intersecting each other in first to fourth directions. A first code pattern of the plurality of code patterns comprise a conductive pattern having a plurality of stems extending from an intersection point between the first and second metal patterns. The plurality of stems extend in the first to fourth directions in the first code pattern. The first code pattern encodes a null value.

In an embodiment, a modulus of the buffer part may be lower than a modulus of each of the display unit and the touch sensing unit.

According to an embodiment of the present disclosure, a display device comprises a display unit comprising a plurality of light-emitting areas emitting light, a touch sensing unit disposed on the display unit to sense a touch, a polarizing film disposed on the touch sensing unit, an adhesive part disposed on the polarizing film, a metal pattern disposed on the adhesive part and has a mesh structure, and a cover member disposed on the adhesive part and the metal pattern. The metal pattern comprises a plurality of code patterns. Each of the plurality of code patterns have a cut shape that encodes position information.

In an embodiment, a modulus of the adhesive part may be lower than a modulus of each of the display unit, the touch sensing unit, the polarizing film, and the cover member.

In an embodiment, the metal pattern comprises a single layer disposed on the adhesive part.

According to an embodiment of the present disclosure, a display device comprises a display unit comprising a plurality of light-emitting areas emitting light, a touch sensing unit disposed on the display unit to sense a touch, a polarizing film disposed on the touch sensing unit, an adhesive part disposed on the polarizing film, a cover member disposed on the adhesive part, and a metal pattern formed as a single layer on the cover member and has a mesh structure. The metal pattern comprises a plurality of code patterns having a cut shape that encodes position information.

In an embodiment, the metal pattern may reduce scattering and absorption of visible light, infrared light and ultraviolet light and may be identifiable using the visible light, the infrared light or the ultraviolet light.

According to an embodiment of the disclosure, a touch input system comprises a display device displaying an image, and a touch input device inputting a touch to the display device. The display device comprises a display unit comprising a plurality of light-emitting areas emitting light, a touch sensing unit disposed on the display unit to sense a touch, and a metal pattern formed as a single layer on the touch sensing unit and comprises a plurality of code patterns. Each of the plurality of code patterns has a cut shape that encodes position information. The touch input device photographs the plurality of code patterns, converts the code patterns into preset data codes and transmits coordinate data consisting of the data codes to the display device.

In an embodiment, the touch input device may comprise a camera photographing the plurality of code patterns, a processor converting the plurality of code patterns into the preset data codes by analyzing an image of the plurality of code patterns and generating coordinate data consisting of the present data codes, and a communication module transmitting the coordinate data to the display device.

In an embodiment, the display device may further comprise a communication unit receiving coordinate data from the communication module, a main processor generating image data based on the coordinate data, and a display unit displaying an image based on the image data.

BRIEF DESCRIPTION OF THE DRAWINGS

These and/or other aspects will become apparent and more readily appreciated from the following description of the embodiments, taken in conjunction with the accompanying drawings in which:

FIG. 10 illustrates data codes corresponding to code patterns of FIG. 9 according to an embodiment of the present disclosure;

DETAILED DESCRIPTION OF EMBODIMENTS

Figure 1:
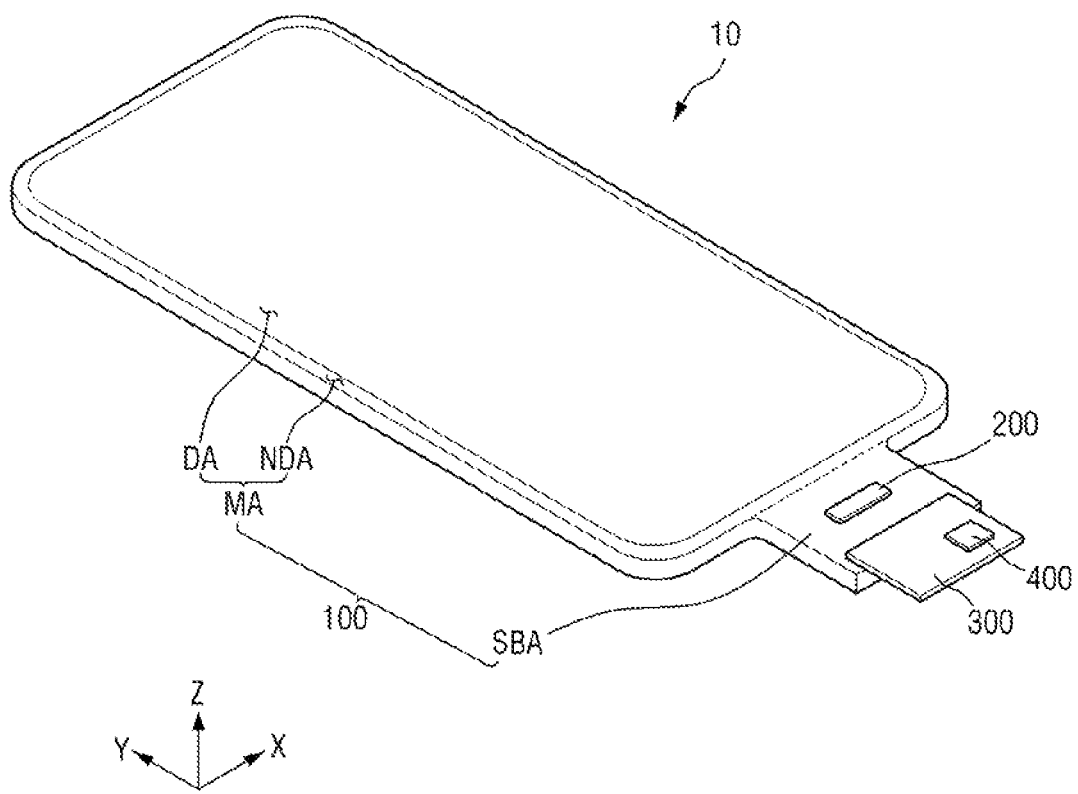
FIG. 1 is a perspective view of a display device according to an embodiment of the present disclosure.

In the following description, for the purposes of explanation, numerous specific details are set forth to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that cross each other in various different non-perpendicular angles, respectively.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to cross-sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions might not reflect actual shapes of regions of a device and are not necessarily intended to be limiting.

Some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a perspective view of a display device 10 according to an embodiment.

Referring to FIG. 1, in an embodiment, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPC's). In an embodiment, the display device 10 may be applied as a display unit of a television, a notebook computer, a monitor, a billboard, or the Internet of things (IoT). In an embodiment, the display device 10 may be applied to wearable devices such as smart watches, watch phones, glass-like displays, and head-mounted displays (HMDs). In an embodiment, the display device 10 may be applied to a dashboard of a vehicle, a center fascia of a vehicle, a center information display (CID) disposed on a dashboard of a vehicle, a room mirror display in place of a side mirror of a vehicle, or a display disposed on the back of a front seat as an entertainment for rear-seat passengers of a vehicle. However, embodiments of the present disclosure are not limited thereto and the display device 10 may be applied to various different small, medium or large-scaled electronic devices.

The display device 10 may have a planar shape similar to a quadrangle. For example, in an embodiment the display device 10 may have a planar shape similar to a quadrangle having relatively short sides in an X-axis direction (the "X direction") and relatively long sides in a Y-axis direction (the "Y direction"). Each corner where a relatively short side extending in the X direction meets a relatively long side extending in the Y direction may be rounded with a predetermined curvature or may be right-angled. However, the planar shape of the display device 10 is not limited to the quadrangular shape but may also be similar to other polygonal shapes, a circular shape, an oval shape, an irregular shape, etc.

The display device 10 may include a display panel 100, a display driver 200, a circuit board 300, and a touch driver 400.

The display panel 100 may include a main area MA and a sub-area SBA.

The main area MA may include a display area DA including pixels displaying an image and a non-display area NDA disposed around the display area DA. For example, in an embodiment, the non-display area NDA may completely surround the display area DA (e.g., in the X and/or Y directions). However, embodiments of the present disclosure are not limited thereto and the non-display area NDA might not surround the display area DA on at least one side. The display area DA may emit light from a plurality of light-emitting areas or a plurality of opening areas. For example, the display panel 100 may include a pixel circuit including switching elements, a pixel defining layer defining the light-emitting areas or the opening areas, and a self-light emitting element.

For example, in an embodiment, the self-light emitting element may include, but is not limited to, at least one of an organic light emitting diode including an organic light emitting layer, a quantum dot light emitting diode including a quantum dot light emitting layer, and an inorganic light emitting diode including an inorganic semiconductor.

The non-display area NDA may be an area outside the display area DA. The non-display area NDA may be defined as an edge area of the main area MA of the display panel 100. In an embodiment, the non-display area NDA may include a gate driver which supplies gate signals to gate lines and fan-out lines which connect the display driver 200 and the display area DA.

In an embodiment, the sub-area SBA may extend from at least one side of the main area MA. For example, as shown in FIG. 1, in an embodiment, the sub-area SBA may extend from a lower side of the main area MA (e.g., in the Y direction). The sub-area SBA may include a flexible material that can be bent, folded, rolled, etc. For example, when the sub-area SBA is bent, it may be overlapped by the main area MA in a thickness direction, such as in a direction of the Z-axis (the "Z direction"). In an embodiment, the sub-area SBA may include the display driver 200 and a pad unit connected to the circuit board 300. However, embodiments of the present disclosure are not limited thereto. For example, in an embodiment, the sub-area SBA may be omitted from the display device 10, and the display driver 200 and the pad unit may be disposed in the non-display area NDA.

The display driver 200 may output signals and voltages for driving the display panel 100. The display driver 200 may supply data voltages to data lines. The display driver 200 may supply a power supply voltage to a power line and supply a gate control signal to the gate driver. In an embodiment, the display driver 200 may be formed as an integrated circuit and mounted on the display panel 100 by a chip on glass (COG) method, a chip on plastic (COP) method, or an ultrasonic bonding method. However, embodiments of the present disclosure are not limited thereto. For example, the display driver 200 may be disposed in the sub-area SBA and may be overlapped by the main area MA in the thickness direction (e.g., the Z direction) by the bending of the sub-area SBA. In an embodiment, the display driver 200 may be mounted on the circuit board 300.

In an embodiment, the circuit board 300 may be attached onto the pad unit of the display panel 100 using an anisotropic conductive film. Lead lines of the circuit board 300 may be electrically connected to the pad unit of the display panel 100. The circuit board 300 may be a flexible printed circuit board, a printed circuit board, or a flexible film such as a chip on film. However, embodiments of the present disclosure are not limited thereto.

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and sense a change in capacitance between the touch electrodes. For example, in an embodiment, the touch driving signal may be a pulse signal having a predetermined frequency. The touch driver 400 may calculate whether a touch has been input and touch coordinates based on the change in capacitance between the touch electrodes. In an embodiment, the touch driver 400 may be formed as an integrated circuit.

Figure 2:
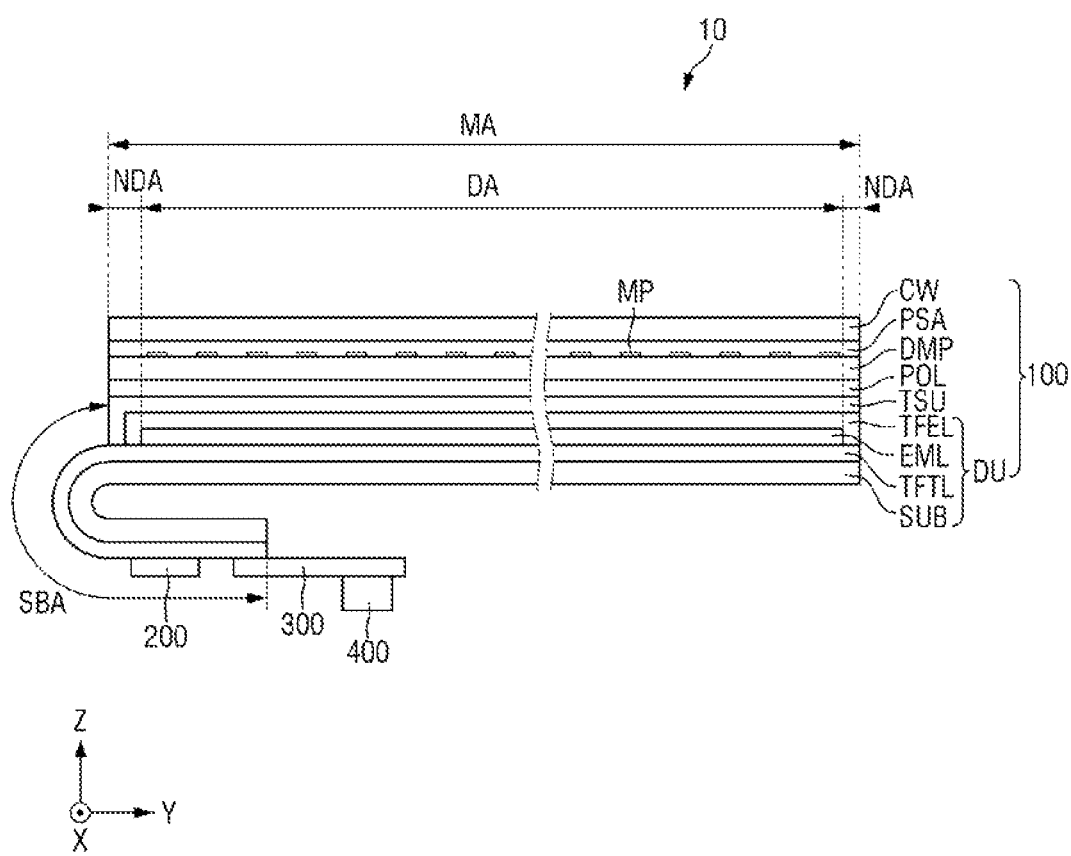
FIG. 2 is a cross-sectional view of the display device according to an embodiment of the present disclosure.

FIG. 2 is a cross-sectional view of the display device 10 according to an embodiment of the present disclosure.

Referring to FIG. 2, in an embodiment, the display panel 100 may include a display unit DU, a touch sensing unit TSU, a polarizing film POL, a buffer part DMP, a metal pattern MP, an adhesive part PSA, and a cover member CW. The display unit DU may include a substrate SUB, a thin-film transistor layer TFTL, a light emitting element layer EML, and an encapsulation layer TFEL.

The substrate SUB may be a base substrate or a base member. The substrate SUB may include the main area MA and the sub-area SBA, and the main area MA may include the display area DA and the non-display area NDA. In an embodiment, the substrate SUB may be a flexible substrate that can be bent, folded, rolled, deformed, etc. For example, the substrate SUB may include a glass material or a metal material. However, embodiments of the present disclosure are not limited thereto and the material of the substrate SUB may vary. For example, the substrate SUB may include polymer resin such as polyimide (PI).

The sub-area SBA of the substrate SUB may extend from at least one side of the main area MA. The sub-area SBA may include a flexible material that can be bent, folded, rolled, etc. For example, when the sub-area SBA is bent, it may be overlapped by the main area MA in the thickness direction (e.g., the Z direction). The sub-area SBA may include the display driver 200 and the pad unit connected to the circuit board 300.

The thin-film transistor layer TFTL may be disposed on the substrate SUB. The thin-film transistor layer TFTL may include a plurality of thin-film transistors constituting pixel circuits of pixels. The thin-film transistor layer TFTL may further include gate lines, data lines, power lines, gate control lines, fan-out lines connecting the display driver 200 and the data lines, and lead lines connecting the display driver 200 and the pad unit. Each of the thin-film transistors may include a semiconductor region, a source electrode, a drain electrode, and a gate electrode. For example, when the gate driver is disposed on a side of the non-display area NDA of the display panel 100, the gate driver may include thin-film transistors.

The thin-film transistor layer TFTL may be disposed in the display area DA, the non-display area NDA, and the sub-area SBA. The thin-film transistors of the pixels, the gate lines, the data lines, and the power lines of the thin-film transistor layer TFTL may be disposed in the display area DA. The gate control lines and the fan-out lines of the thin-film transistor layer TFTL may be disposed in the non-display area NDA. The lead lines of the thin-film transistor layer TFTL may be disposed in the sub-area SBA.

The light emitting element layer EML may be disposed on the thin-film transistor layer TFTL (e.g., disposed directly thereon in the Z direction). The light emitting element layer EML may include a plurality of light emitting elements, each including a first electrode, a light emitting layer and a second electrode sequentially stacked (e.g., in the Z direction) to emit light, and the pixel defining layer defining the pixels. The light emitting elements of the light emitting element layer EML may be disposed in the display area DA.

For example, in an embodiment, the light emitting layer may be an organic light emitting layer including an organic material. The light emitting layer may include a hole transporting layer, an organic light emitting layer, and an electron transporting layer. When the first electrode receives a predetermined voltage through a thin-film transistor of the thin-film transistor layer TFTL and the second electrode receives a low-potential voltage, holes and electrons may move to the organic light emitting layer through the hole transporting layer and the electron transporting layer, respectively, and may combine together in the organic light emitting layer to emit light. For example, the first electrode may be an anode, and the second electrode may be a cathode. However, embodiments of the present disclosure are not limited thereto.

For example, in an embodiment, the light emitting elements may include a quantum dot light emitting diode including a quantum dot light emitting layer or an inorganic light emitting diode including an inorganic semiconductor.

The encapsulation layer TFEL may cover upper and lateral side surfaces of the light emitting element layer EML and may protect the light emitting element layer EML. The encapsulation layer TFEL may include at least one inorganic layer and at least one organic layer to encapsulate the light emitting element layer EML.

The touch sensing unit TSU may be disposed on the encapsulation layer TFEL. The touch sensing unit TSU may include a plurality of touch electrodes for sensing a user's touch in a capacitive manner and touch lines connecting the touch electrodes and the touch driver 400. For example, in an embodiment, the touch sensing unit TSU may sense a user's touch in a mutual capacitance manner or a self-capacitance manner.

However, embodiments of the present disclosure are not limited thereto. For example, in an embodiment, the touch sensing unit TSU may be disposed on a separate substrate disposed on the display unit DU. In this embodiment, the substrate supporting the touch sensing unit TSU may be an encapsulation substrate that encapsulates the display unit DU.

The touch electrodes of the touch sensing unit TSU may be disposed in a touch sensor area overlapping the display area DA (e.g., in the Z direction). The touch lines of the touch sensing unit TSU may be disposed in a touch peripheral area overlapping the non-display area NDA (e.g., in the Z direction).

The polarizing film POL may be disposed on the touch sensing unit TSU (e.g., directly thereon in the Z direction). In an embodiment, the polarizing film POL may be attached onto the touch sensing unit TSU by an optically clear adhesive (OCA) film or an optically clear resin (OCR). For example, the polarizing film POL may include a linear polarizer and a retardation film such as a quarter ($\lambda/4$)-wave plate. The retardation film and the linear polarizer may be sequentially stacked on the touch sensing unit TSU. However, embodiments of the present disclosure are not limited thereto. For example, in an embodiment, the polarizing film POL may include a plurality of color filters. Each of the color filters may selectively transmit light of a specific color and block or absorb light of colors that are different from the specific color.

The buffer part DMP may be disposed on the polarizing film POL to protect the display panel 100 from external impact (e.g., disposed directly thereon in the Z direction). In an embodiment, the buffer part DMP may be a damping layer or a damping film. For example, in an embodiment, a modulus of the buffer part DMP may be lower than a modulus of each of the display unit DU, the touch sensing unit TSU, the polarizing film POL, the adhesive part PSA, and the cover member CW. Therefore, the buffer part DMP may increase the durability of the display panel 100 by cushioning an impact or stress applied on the display panel 100. The buffer part DMP may have a predetermined thickness (e.g., length in the Z direction) sufficient to cushion the impact or stress of the display panel 100. In an embodiment, the buffer part DMP may include at least one compound selected from polyurethane, polyethylene, and polypropylene. However, embodiments of the present disclosure are not limited thereto. The buffer part DMP may be a transparent film and may transmit light, which passes through the polarizing film POL, without modifying the light.

The metal pattern MP may be disposed on the buffer part DMP (e.g., in the Z direction). In an embodiment, the metal pattern MP may have a single layer-mesh structure or net structure in plan view (e.g., in a plane defined in the X and Y directions). Minimum unit sides of the metal pattern MP may extend in different directions to intersect each other. The mesh structure of the metal pattern MP may have a predetermined intersection angle. The intersection angle of the metal pattern MP may be designed to reduce or prevent a moire phenomenon. For example, in an embodiment, a line width of the metal pattern MP may be in a range of about 3 μm or less, and a pitch of the metal pattern MP may be in a range of about 500 μm or less. However, embodiments of the present disclosure are not limited thereto. Since the line width of the metal pattern MP is in a range of about 3 μm or less, the metal pattern MP might not be visible to the eyes of a user, and the moire phenomenon may be prevented. When the line width of the metal pattern MP is greater than about 3 μm, the metal pattern MP may be visible to the user. Since the pitch of the metal pattern MP is in a range of about 500 μm or less, code patterns of the metal pattern MP may be easily identified by a camera of a touch input device. When the pitch of the metal pattern MP is greater than about 500 μm, it may be difficult for the camera of the touch input device to easily photograph the code patterns. Since the display device 10 includes the metal pattern MP having a relatively reduced line width and a relatively increased pitch, visibility of the code patterns of the metal pattern MP is increased. In an embodiment, the metal pattern MP may include at least one compound selected from molybdenum (Mo), titanium (Ti), copper (Cu), aluminum (Al), gold (Au), silver (Ag), palladium (Pd), chromium (Cr), and indium tin oxide (ITO). However, embodiments of the present disclosure am not limited thereto. In an embodiment, the metal pattern MP may be formed on the buffer part DMP through a metal transfer process. However, embodiments of the present disclosure are not limited thereto. Since the metal pattern MP is formed as a single layer on the buffer part DMP, the metal pattern MP can be bent, folded or rolled, and a manufacturing cost can be reduced.

In an embodiment, the metal pattern MP may be electrically independent. For example, the metal pattern MP may be floating (e.g., electrically floating) by being electrically independent or may be grounded by being connected to a ground line.

The metal pattern MP may minimize scattering and absorption of visible light, infrared light and ultraviolet light and thus may be identified using visible light, infrared light or ultraviolet light. For example, the metal pattern MP may be blackened to reduce the reflection of external light and increase contrast ratio. In an embodiment of the present disclosure, the metal pattern MP may include the code patterns, and the code patterns of the metal pattern MP may be photographed by the camera of the touch input device. Therefore, the touch input device may identify the code patterns embedded in the metal pattern MP.

In an embodiment, the adhesive part PSA may attach the cover member CW onto the buffer part DMP and the metal pattern MP. For example, in an embodiment the adhesive part PSA may be a double-sided tape or an adhesive film having a high level of bonding and adhesive strength. For example, in an embodiment, the adhesive part PSA may include at least one material selected from a pressure sensitive adhesive, an optical clear adhesive, and an optical clear resin. However, embodiments of the present disclosure are not limited thereto. For example, a thickness of the adhesive part PSA may be less than that of the buffer part DMP.

The cover member CW may be disposed on the adhesive part PSA (e.g., directly thereon in the Z direction). The cover member CW may be attached onto the buffer part DMP and the metal pattern MP by the adhesive part PSA. The cover member CW may protect an upper surface of the display panel 100. The cover member CW may include a transparent material to transmit light. For example, in an embodiment, the cover member CW may be a cover window, a cover glass, or a cover film. However, embodiments of the present disclosure are not limited thereto.

Figure 3:
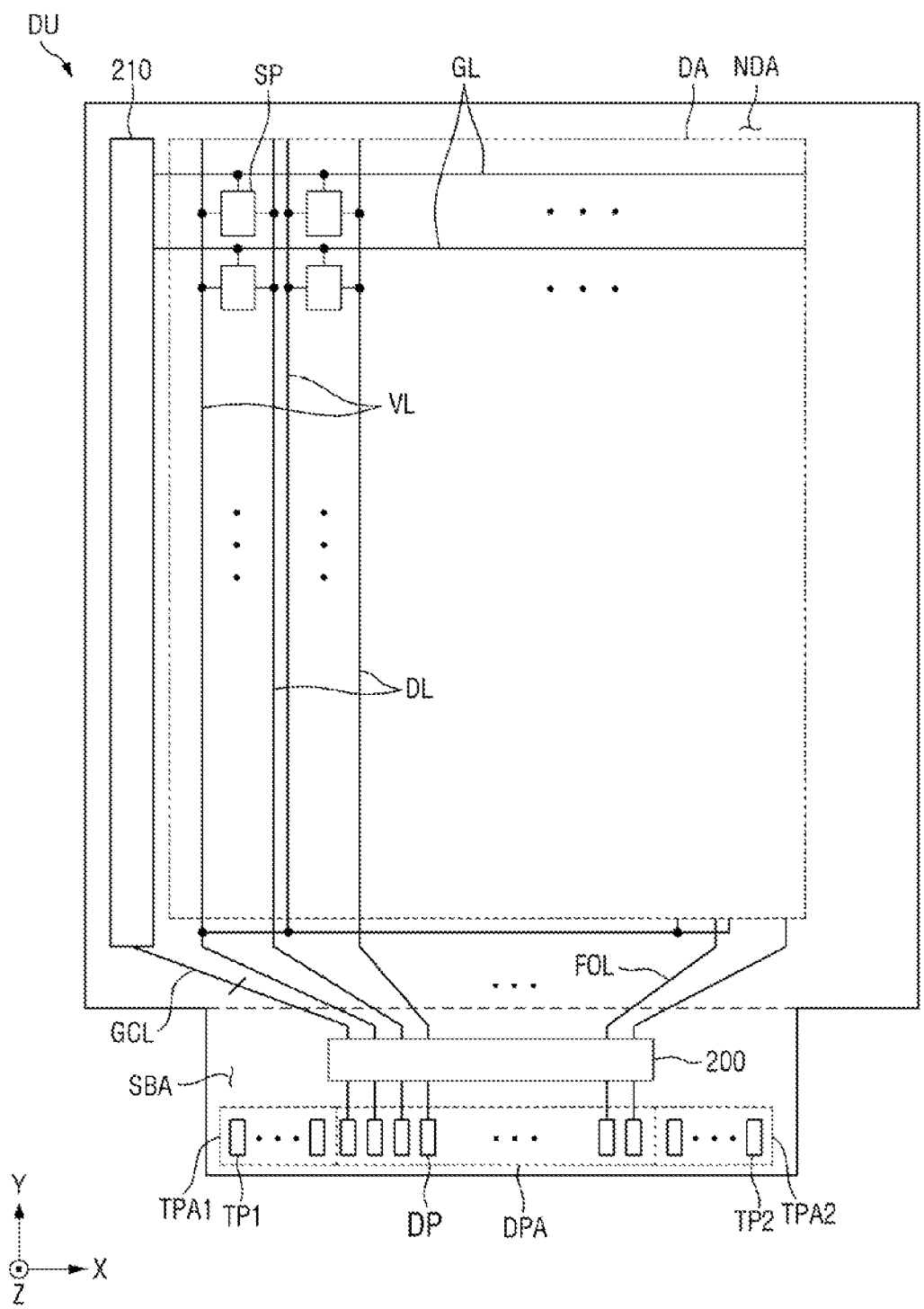
FIG. 3 is a plan view of a display unit of the display device according to an embodiment of the present disclosure.

FIG. 3 is a plan view of the display unit DU of the display device 10 according to an embodiment of the present disclosure.

Referring to FIG. 3, the display unit DU may include the display area DA and the non-display area NDA.

The display area DA is an area for displaying an image and may be defined in a central area of the display panel 100 (e.g., in the X and Y directions). However, embodiments of the present disclosure are not limited thereto and the positioning of the display area DA may vary. The display area DA may include a plurality of pixels SP, a plurality of gate lines GL, a plurality of data lines DL, and a plurality of power lines VL. Each of the pixels SP may be defined as a minimum unit that outputs light.

The gate lines GL may supply gate signals received from a gate driver 210 to the pixels SP. In an embodiment, the gate lines GL may extend in the X direction and may be spaced apart from each other in the Y direction.

The data lines DL may supply data voltages received from the display driver 200 to the pixels SP. The data lines DL may extend in the Y direction and may be spaced apart from each other in the X direction.

The power lines VL may supply a power supply voltage received from the display driver 200 to the pixels SP. In an embodiment, the power supply voltage may be at least one of a driving voltage, an initialization voltage, and a reference voltage. The power lines V L may extend in the Y direction and may be spaced apart from each other in the X direction.

The non-display area NDA may surround the display area DA (e.g., in the X and/or Y directions). The non-display area NDA may include the gate driver 210, gate control lines GCL, and fan-out lines FOL. The gate driver 210 may generate a plurality of gate signals based on a gate control signal and sequentially supply the gate signals to the gate lines GL according to a set order.

The gate control lines GCL may extend from the display driver 200 to the gate driver 210. The gate control lines GCL may supply the gate control signal received from the display driver 200 to the gate driver 210.

The fan-out lines FOL may extend from the display driver 200 to the display area DA. The fan-out lines FOL may supply the data voltages received from the display driver 200 to the data lines DL.

The sub-area SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the pixels SP and may determine luminances of the pixels SP. The display driver 200 may supply the gate control signal to the gate driver 210 through the gate control lines CGL.

The display pad area DPA, the first touch pad area TPA1, and the second touch pad area TPA2 may be disposed at an edge of the sub-area SBA. For example, as shown in FIG. 3, in an embodiment, the first touch pad area TPA1 and the second touch pad area TPA2 may be disposed at a lower edge of the sub-area SBA (e.g., in the Y direction). The display pad area DPA, the first touch pad area TPA1, and the second touch pad area TPA2 may be electrically connected to the circuit board 300 using an anisotropic conductive film or a low-resistance high-reliability material such as SAP.

The display pad area DPA may include a plurality of display pad units DP. The display pad units DP may be connected to a main processor through the circuit board 300. The display pad units DP may be connected to the circuit board 300 to receive digital video data and may supply the digital video data to the display driver 200.

Figure 4:
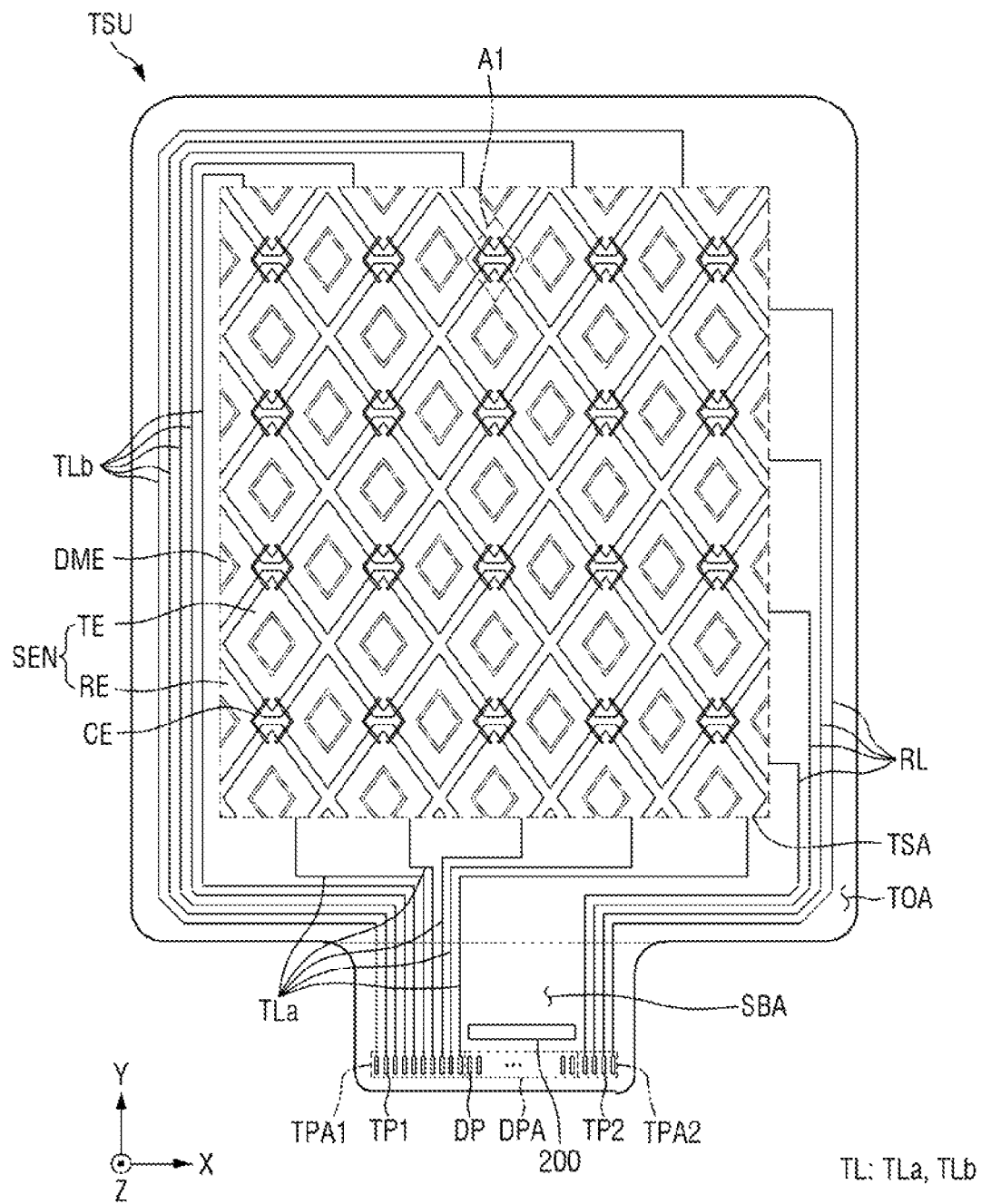
FIG. 4 is a plan view of a touch sensing unit of the display device according to an embodiment of the present disclosure.

FIG. 4 is a plan view of the touch sensing unit TSU of the display device 10 according to an embodiment of the present disclosure.

Referring to FIG. 4, the touch sensing unit TSU may include a touch sensor area TSA for sensing a user's touch and a touch peripheral area TOA disposed around the touch sensing area TSA (e.g., in the X and/or Y directions). The touch sensor area TSA may overlap the display area DA of the display unit DU (e.g., in the Z direction), and the touch peripheral area TOA may overlap the non-display area NDA of the display unit DU (e.g., in the Z direction).

The touch sensor area TSA may include a plurality of touch electrodes SEN and a plurality of dummy electrodes DME. In an embodiment, the touch electrodes SEN may form mutual capacitance or self-capacitance to sense a touch of an object or a person. The touch electrodes SEN may include a plurality of driving electrodes TE and a plurality of sensing electrodes RE.

The driving electrodes TE may be arranged in the X direction and the Y direction. The driving electrodes TE may be spaced apart from each other in the X direction and the Y direction. In an embodiment, the driving electrodes TE adjacent to each other in the Y direction may be electrically connected through bridge electrodes CE.

The driving electrodes TE may be connected to first touch pad units TP1 through driving lines TL. The driving lines TL may include lower driving lines TLa and upper driving lines TLb. For example, a first plurality of driving electrodes TE disposed on a lower side of the touch sensor area TSA may be connected to the first touch pad units TP1 through the lower driving lines TLa, and a second plurality of driving electrodes TE that are different from the first plurality of driving electrodes TE are disposed on an upper side of the touch sensor area TSA and may be connected to the first touch pad units TP1 through the upper driving lines TLb. The lower driving lines TLa may extend to the first touch pad units TP1 via a lower side of the touch peripheral area TOA. The upper driving lines TLb may extend to the first touch pad unit TP1 via upper, left and lower sides of the touch peripheral area TOA. The first touch pad units TP1 may be connected to the touch driver 400 through the circuit board 300.

In an embodiment, the bridge electrodes CE may have at least one bend in its planar shape. For example, each of the bridge electrodes CE may be shaped like a bracket ("<" or ">"). However, the planar shape of each of the bridge electrodes CE is not limited thereto. In an embodiment, the driving electrodes TE adjacent to each other in the Y direction may be connected by a plurality of bridge electrodes CE. Therefore, even if any one of the bridge electrodes CE is broken, the driving electrodes TE may be stably connected through the other bridge electrodes CE. In an embodiment, the driving electrodes TE adjacent to each other may be connected by two bridge electrodes CE. However, embodiments of the present disclosure are not limited thereto and the number of bridge electrodes CE may vary.

The bridge electrodes CE may be disposed on a different layer from the driving electrodes TE and the sensing electrodes RE. The sensing electrodes RE adjacent to each other in the X direction may be electrically connected through a connection part disposed on the same layer as the driving electrodes TE or the sensing electrodes RE. The driving electrodes TE adjacent to each other in the Y direction may be electrically connected through the bridge electrodes CE disposed on a different layer from the driving electrodes TE or the sensing electrodes RE. Therefore, even if the bridge electrodes CE overlap the sensing electrodes RE in the Z direction, the driving electrodes TE and the sensing electrodes RE may be insulated from each other. Mutual capacitance may be formed between the driving electrodes TE and the sensing electrodes RE.

In an embodiment, the sensing electrodes RE may extend in the X direction and may be spaced apart from each other in the Y direction. The sensing electrodes RE may be arranged in the X direction and the Y direction, and the sensing electrodes RE adjacent to each other in the X direction may be electrically connected through a connection part.

The sensing electrodes RE may be connected to second touch pad units TP2 through sensing lines RL. For example, some sensing electrodes RE disposed on a right side of the touch sensor area TSA may be connected to the second touch pad units TP2 through the sensing lines RL. The sensing lines RL may extend to the second touch pad units TP2 via the right and lower sides of the touch peripheral area TOA. The second touch pad units TP2 may be connected to the touch driver 400 through the circuit board 300.

Each of the dummy electrodes DME may be surrounded by a driving electrode TE or a sensing electrode RE. Each of the dummy electrodes DME may be spaced apart and insulated from the driving electrode TE or the sensing electrode RE. Therefore, the dummy electrodes DME may be electrically floating.

The display pad area DPA, the first touch pad area TPA1, and the second touch pad area TPA2 may be disposed at an edge of the sub-area SBA. In an embodiment, the display pad area DPA, the first touch pad area TPA1, and the second touch pad area TPA2 may be electrically connected to the circuit board 300 using an anisotropic conductive film or a low-resistance high-reliability material such as SAP.

The first touch pad area TPA1 may be disposed on a side of the display pad area DPA and may include a plurality of first touch pad units TP1. The first touch pad units TP1 may be electrically connected to the touch driver 400 disposed on the circuit board 300. The first touch pad units TP1 may supply a touch driving signal to the driving electrodes TE through the driving lines TL.

The second touch pad area TPA2 may be disposed on the other side of the display pad area DPA and may include a plurality of second touch pad units TP2. For example, as shown in FIG. 4, in an embodiment, the first touch pad area TPA1 may be disposed on a left side (e.g., in the X direction) of the display pad area DPA and the second touch pad area TPA2 may be disposed on the right side (e.g., in the X direction) of the display pad area DPA. The second touch pad units TP2 may be electrically connected to the touch driver 400 disposed on the circuit board 300. The touch driver 400 may receive a touch sensing signal through the sensing lines RL connected to the second touch pad units TP2 and sense a change in mutual capacitance between the driving electrodes TE and the sensing electrodes RE.

However, embodiments of the present disclosure are not limited thereto. For example, in an embodiment, the touch driver 400 may supply a touch driving signal to each of the driving electrodes TE and the sensing electrodes RE and receive a touch sensing signal from each of the driving electrodes TE and the sensing electrodes RE. The touch driver 400 may sense the amount of charge change of each of the driving electrodes TE and the sensing electrodes RE based on the touch sensing signal.

Figure 5:
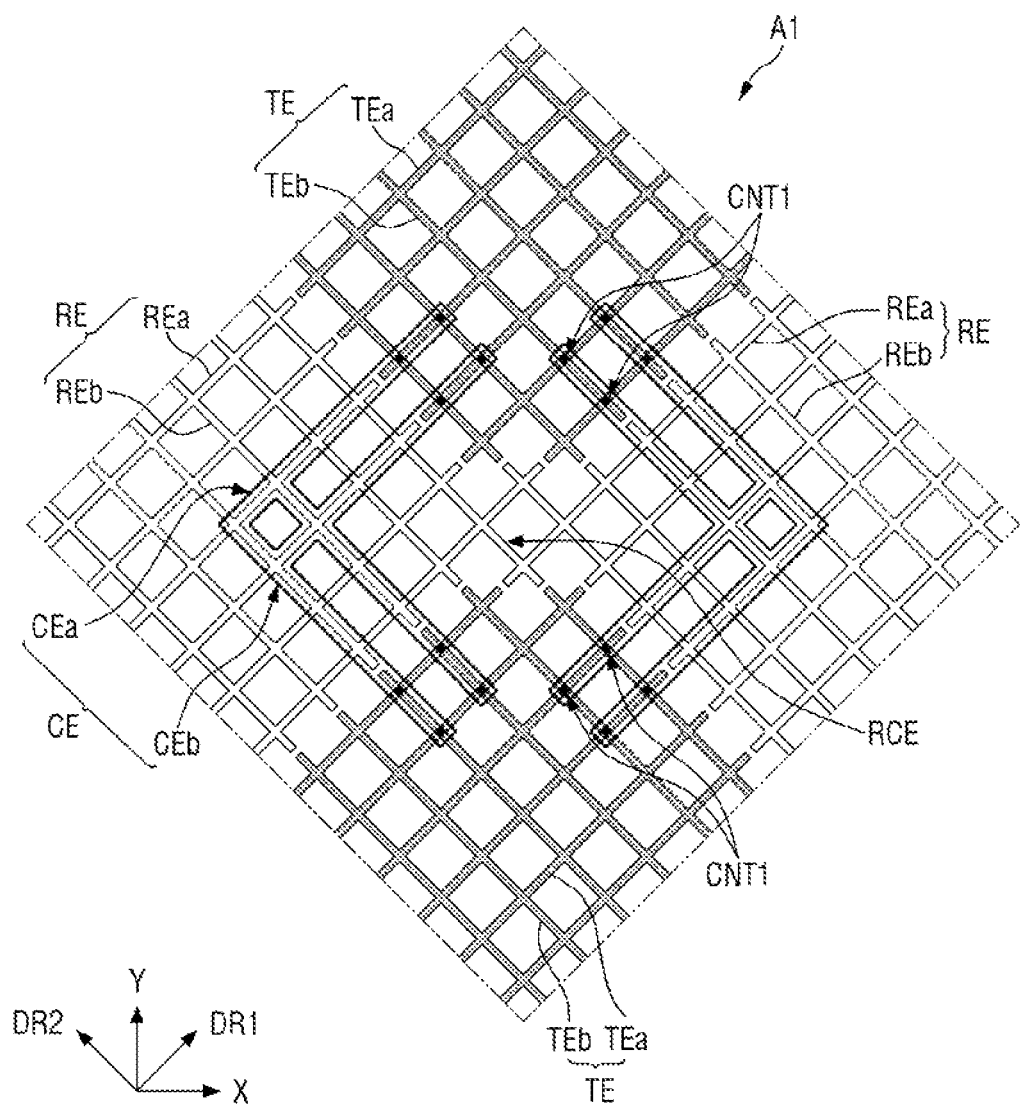
FIG. 5 is an enlarged view of area A1 of FIG. 4 according to an embodiment of the present disclosure.
Figure 6:
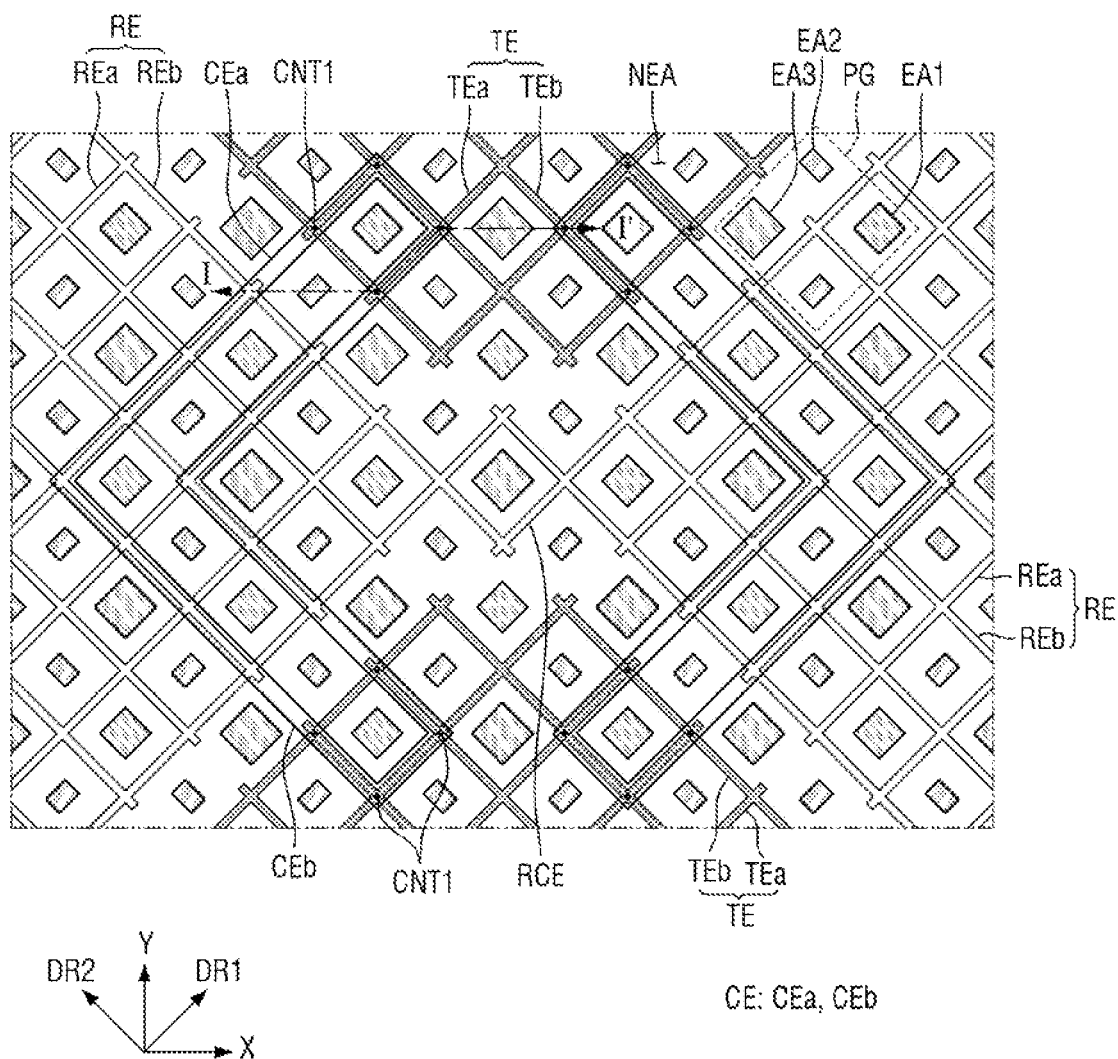
FIG. 6 is an enlarged view of a portion of the display device according to an embodiment of the present disclosure.

FIG. 5 is an enlarged view of area A1 of FIG. 4. FIG. 6 is an enlarged view of a part of the display device 10 according to an embodiment of the present disclosure.

Referring to FIGS. 5 and 6, the driving electrodes TE, the sensing electrodes RE, and the dummy electrodes DME may be disposed on the same layer and may be spaced apart from each other.

The driving electrodes TE may be arranged in the X direction and the Y direction and may extend in the Y direction. The driving electrodes TE may be spaced apart from each other in the X direction and the Y direction. The driving electrodes TE adjacent to each other in the Y direction may be electrically connected through the bridge electrodes CE.

The sensing electrodes RE may extend in the X direction and may be spaced apart from each other in the Y direction. The sensing electrodes RE may be arranged in the X direction and the Y direction, and the sensing electrodes RE adjacent to each other in the X direction may be electrically connected through a connection part RCE. For example, in an embodiment, the connection part RCE of the sensing electrodes RE may be disposed within a shortest distance between the driving electrodes TE adjacent to each other.

The bridge electrodes CE may be disposed on a different layer from the driving electrodes TE and the sensing electrodes RE. Each of the bridge electrodes CE may include a first part CEa and a second part CEb. For example, the first part CEa of each of the bridge electrodes CE may be connected to a driving electrode TE disposed on a side through first contact holes CNT1 and may extend in a first direction DR1. The second part CEb of each of the bridge electrodes CE may have a bend from the first part CEa in an area overlapping a sensing electrode RE and may extend in a direction opposite to a second direction DR2. The second part CEb may be connected to a driving electrode TE disposed on the other side through first contact holes CNT1. In the following description, the first direction DR1 may be a direction between the X direction and the Y direction, and the second direction DR2 may be a direction between a direction opposite to the X direction and the Y direction. Therefore, each of the bridge electrodes CE may connect the driving electrodes TE adjacent to each other in the Y direction.

The driving electrodes TE, the sensing electrode RE, and the dummy electrodes DME may be formed in a mesh structure or a net structure in plan view. For example, the driving electrodes TE, the sensing electrodes RE, and the dummy electrodes DME may surround each of first through third light-emitting areas EA1 through EA3 of each pixel group PG in a plan view. The first through third light-emitting areas EA1 through EA3 may be surrounded by a non-light-emitting area NEA. In another example, the driving electrodes TE, the sensing electrodes RE, and the dummy electrodes may surround the pixel groups PG in a plan view. Therefore, the driving electrodes TE, the sensing electrodes RE, and the dummy electrodes DME might not overlap the first through third light-emitting areas EA1 through EA3. The bridge electrodes CE may also not overlap the first through third light-emitting areas EA1 through EA3. Therefore, the display device 10 can prevent the luminance of light emitted from the first through third light-emitting areas EA1 through EA3 from being reduced by the touch sensing unit TSU.

In an embodiment, each of the driving electrodes TE may include a first part TEa extending in the first direction DR1 and a second part TEb extending in the second direction DR2. Each of the sensing electrodes RE may include a first part REa extending in the first direction DR1 and a second part REb extending in the second direction DR2.

A plurality of pixels may include first through third subpixels, and each of the first through third subpixels may include one of the first through third light-emitting areas EA1 through EA3. For example, the first light-emitting area EA1 may emit light of a first color, such as red light, the second light-emitting area EA2 may emit light of a second color, such as green light, and the third light-emitting area EA3 may emit light of a third color, such as blue light. However, embodiments of the present disclosure are not limited thereto and the colors of the first to third light-emitting areas EA1 to EA3 may vary.

In an embodiment, one pixel group PG may include one first light-emitting area EA1, two second light-emitting areas EA2, and one third light-emitting area EA3 to express a white gray level. However, embodiments of the present disclosure are not limited thereto and the number of the first through third light-emitting areas EA1 through EA3 may vary. Therefore, light emitted from one first light-emitting area EA1, light emitted from two second light-emitting areas EA2, and light emitted from one third light-emitting area EA3 may combine to express the white gray level.

Figure 7:
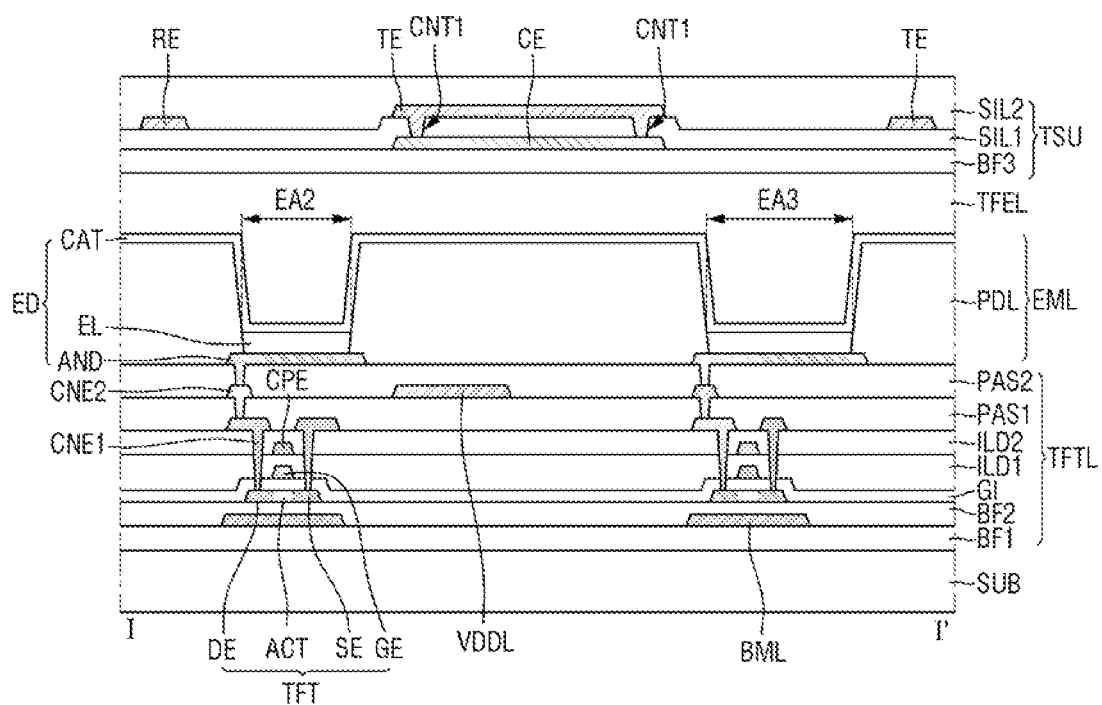
FIG. 7 is a cross-sectional view taken along line I-I' of FIG. 6 according to an embodiment of the present disclosure.

FIG. 7 is a cross-sectional view taken along line I-I' of FIG. 6.

Referring to FIG. 7, the display panel 100 may include the display unit DU and the touch sensing unit TSU. The display unit DU may include the substrate SUB, the thin-film transistor layer TFTL, the light emitting element layer EML, and the encapsulation layer TFEL.

The substrate SUB may be a base substrate or a base member. In an embodiment, the substrate SUB may be a flexible substrate that can be bent, folded, rolled, etc. For example, the substrate SUB may include a glass material or a metal material. However, embodiments of the present disclosure are not limited thereto. For example, in an embodiment, the substrate SUB may include polymer resin such as polyimide (PI).

The thin-film transistor layer TFTL may include a first buffer layer BF1, a light blocking layer BML, a second buffer layer BF2, thin-film transistors TFT, a gate insulating layer GI, a first interlayer insulating film ILD1, a capacitor electrode CPE, a second interlayer insulating film ILD2, a first connection electrode CNE1, a first passivation layer PAS1, a second connection electrode CNE2, and a second passivation layer PAS2.

The first buffer layer BF1 may be disposed on the substrate SUB. In an embodiment, the first buffer layer BF1 may include an inorganic layer that can prevent penetration of air or moisture. For example, the first buffer layer BF1 may include a plurality of inorganic layers stacked alternately.

The light blocking layer BML may be disposed on the first buffer layer BF1. For example, in an embodiment, the light blocking layer BML may be a single layer or a multilayer made of one or more compounds selected from molybdenum (Mo), aluminum (Al), chromium (Cr), gold (Au), titanium (Ti), nickel (Ni), neodymium (Nd), copper (Cu), and alloys of the same. However, embodiments of the present disclosure are not limited thereto. For example, in an embodiment the light blocking layer BML may be an organic layer including a black pigment.

The second buffer layer BF2 may cover the first buffer layer BF1 and the light blocking layer BML. In an embodiment, the second buffer layer BF2 may include an inorganic layer that can prevent penetration of air or moisture. For example, the second buffer layer BF2 may include a plurality of inorganic layers stacked alternately. However, embodiments of the present disclosure are not limited thereto.

The thin-film transistors TFT may be disposed on the second buffer layer BF2 and may constitute respective pixel circuits of the pixels. For example, each of the thin-film transistors TFT may be a driving transistor or a switching transistor of a pixel circuit. Each of the thin-film transistors TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML in a thickness direction. The semiconductor region ACT may be overlapped by the gate electrode GE in the thickness direction and may be insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT in a thickness direction with the gate insulating layer GI interposed between them.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE and the second buffer layer BF2 and may insulate the semiconductor region ACT from the gate electrode GE. The gate insulating layer GI may include contact holes through which the first connection electrode CNE1 passes.

The first interlayer insulating film ILD1 may cover the gate electrode GE and the gate insulating layer GI. The first interlayer insulating film ILD1 may include contact holes through which the first connection electrode CNE1 passes. The contact holes of the first interlayer insulating film ILD1 may be connected to the contact holes of the gate insulating layer GI and contact holes of the second interlayer insulating film ILD2.

The capacitor electrode CPE may be disposed on the first interlayer insulating film ILD1. The capacitor electrodes CPE may overlap the gate electrode GE in the thickness direction.

The second interlayer insulating film ILD2 may cover the capacitor electrode CPE and the first interlayer insulating film ILD1. The second interlayer insulating film ILD2 may include the contact holes through which the first connection electrode CNE1 passes. The contact holes of the second interlayer insulating film IL2 may be connected to the contact holes of the first interlayer insulating film ILD1 and the contact holes of the gate insulating film GI.

The first connection electrode CNE1 may be disposed on the second interlayer insulating film ILD2. The first connection electrode CNE1 may connect the drain electrode DE of each thin-film transistor TFT to the second connection electrode CNE2. The first connection electrode CNE1 may be inserted into the contact holes provided in the second interlayer insulating film ILD2, the first interlayer insulating film ILD1 and the gate insulating layer GI to contact the drain electrode DE of each thin-film transistor TFT.

The first passivation layer PAS1 may cover the first connection electrode CNE1 and the second interlayer insulating film ILD2. The first passivation layer PAS1 may protect the thin-film transistors TFT. The first passivation layer PAS1 may include a contact hole through which the second connection electrode CNE2 passes.

The second connection electrode CNE2 may be disposed on the first passivation layer PAS1. The second connection electrode CNE2 may connect the first connection electrode CNE1 to a pixel electrode AND of each light emitting element ED. The second connection electrode CNE2 may be inserted into the contact hole provided in the first passivation layer PAS1 to contact the first connection electrode CNE1.

The second passivation layer PAS2 may cover the second connection electrode CNE2 and the first passivation layer PAS1. The second passivation layer PAS2 may include a contact hole through which the pixel electrode AND of each light emitting element ED passes.

The light emitting element layer EML may be disposed on the thin-film transistor layer TFTL. The light emitting element layer EML may include the light emitting elements ED and a pixel defining layer PDL. Each of the light emitting elements ED may include the pixel electrode AND, a light emitting layer EL, and a common electrode CAT.

The pixel electrode AND may be disposed on the second passivation layer PAS2. The pixel electrode AND may overlap one of the first through third light-emitting areas EA1 through EA3 defined by the pixel defining layer PDL. In an embodiment, the pixel electrode AND may be connected to the drain electrode DE of each thin-film transistor TFT through the first and second connection electrodes CNE1 and CNE2.

The light emitting layer EL may be disposed on the pixel electrode AND. For example, in an embodiment the light emitting layer EL may be an organic light emitting layer made of an organic material. However, embodiments of the present disclosure are not limited thereto. In an embodiment in which the light emitting layer EL is an organic light emitting layer, if a thin-film transistor TFT applies a predetermined voltage to the first electrode AND of a light emitting element ED and the common electrode CAT of the light emitting element ED receives a common voltage or a cathode voltage, holes and electrons may move to the light emitting layer EL through a hole transporting layer and an electron transporting layer, respectively, and may combine together in the light emitting layer EL to emit light.

The common electrode CAT may be disposed on the light emitting layer EL. For example, the common electrode CAT may be an electrode common to all pixels without distinction between the pixels. The common electrode CXC may be disposed on the light emitting layers EL in the first through third light-emitting areas EA1 through EA3 and may be disposed on the pixel defining layer PDL in an area outside of the first through third light-emitting areas EA1 through EA3.

The common electrode CAT may receive a common voltage or a low-potential voltage. When the pixel electrode AND receives a voltage corresponding to a data voltage and the common electrode CAT receives a low-potential voltage, a potential difference may be formed between the pixel electrode AND and the common electrode CAT so that the light emitting layer EL emits light.

The pixel defining layer PDL may define the first through third light-emitting areas EA1 through EA3. The pixel defining layer PDL may separate and insulate the pixel electrodes AND of the light emitting elements ED from each other.

The encapsulation layer TFEL may be disposed on the common electrode CAT to cover the light emitting elements ED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign substances such as dust.

The touch sensing unit TSU may be disposed on the encapsulation layer TFEL. The touch sensing unit TSU may include a third buffer layer BF3, a bridge electrode CE, a first insulating layer SIL1, a driving electrode TE, a sensing electrode RE, and a second insulating layer SIL2.

The third buffer layer BF3 may be disposed on the encapsulation layer TFEL. The third buffer layer BF3 may have insulating and optical functions. The third buffer layer BF3 may include at least one inorganic layer. However, embodiments of the present disclosure are not limited thereto. For example, in an embodiment, the third buffer layer BF3 may be omitted.

The bridge electrode CE may be disposed on the third buffer layer BF3. The bridge electrode CE may be disposed on a different layer from the driving electrode TE and the sensing electrode RE and may connect driving electrodes TE adjacent to each other in the Y direction.

The first insulating layer SIL1 may cover the bridge electrode CE and the third buffer layer BF3. The first insulating layer SIL1 may have insulating and optical functions. For example, in an embodiment, the first insulating layer SIL1 may be an inorganic layer including at least one layer selected from a silicon nitride layer, a silicon oxynitride layer, a silicon oxide layer, a titanium oxide layer, and an aluminum oxide layer. However, embodiments of the present disclosure are not limited thereto.

The driving electrode TE and the sensing electrode RE may be disposed on the first insulating layer SILL. Each of the driving electrode TE and the sensing electrode RE might not overlap the first through third light-emitting areas EA1 through EA3 (e.g., in a thickness direction). In an embodiment, each of the driving electrode TE and the sensing electrode RE may be formed of a single layer of molybdenum (Mo), titanium (Ti), copper (Cu) or aluminum (Al) or may be formed of a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. However, embodiments of the present disclosure are not limited thereto.

The second insulating layer SIL2 may cover the driving electrode TE, the sensing electrode RE, and the first insulating layer SILL. The second insulating layer SIL2 may have insulating and optical functions. In an embodiment, the second insulating layer SIL2 may be made of at least one of the example materials of the first insulating layer SIL1.

Figure 8:
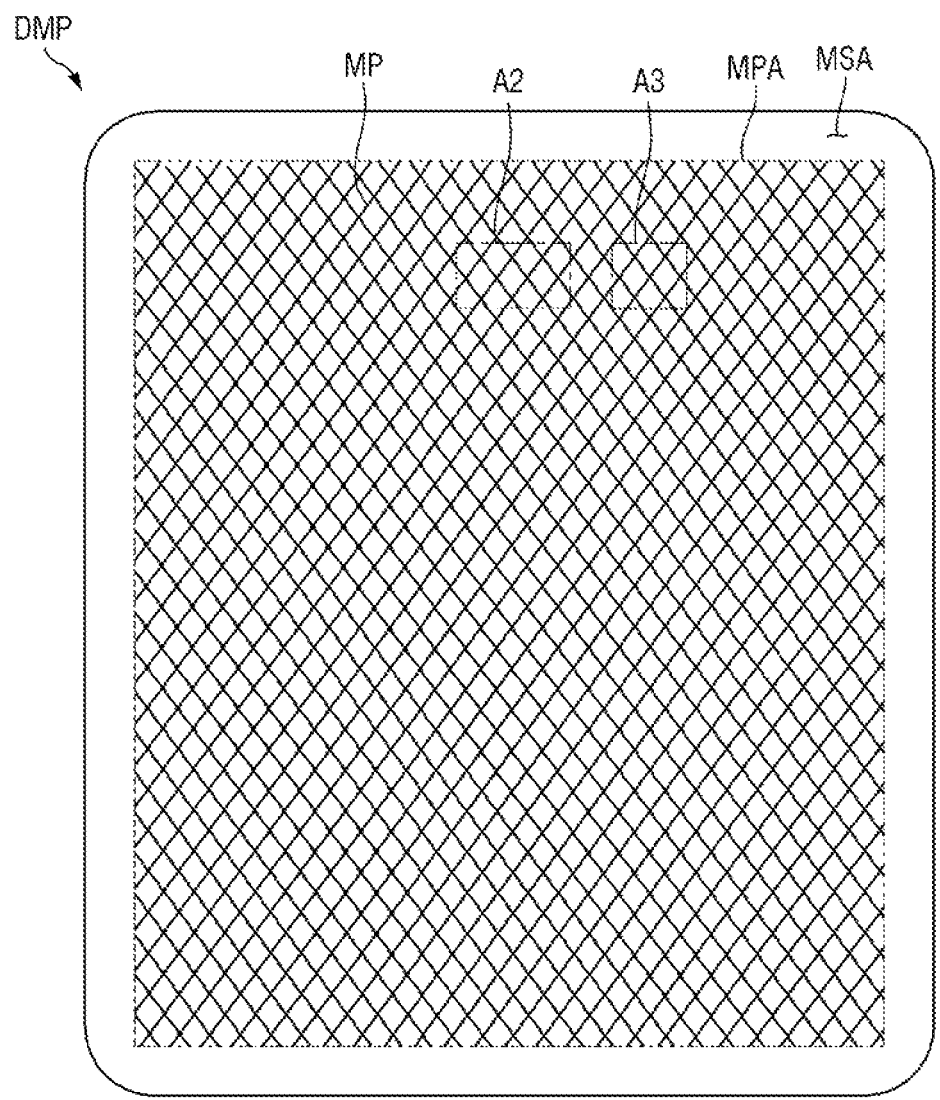
FIG. 8 is a plan view of a buffer part and a metal pattern of the display device according to an embodiment of the present disclosure.
Figure 8:
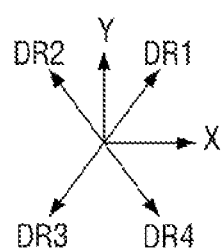

FIG. 8 is a plan view of the buffer part DMP and the metal pattern MP of the display device 10 according to an embodiment of the present disclosure.

Referring to FIG. 8, the buffer part DMP may be disposed on the polarizing film POL to protect the display panel 100 from external impact. In an embodiment, the buffer part DMP may be a damping layer or a damping film. For example, in an embodiment, the modulus of the buffer part DMP may be lower than the modulus of each of the display unit DU, the touch sensing unit TSU, the polarizing film POL, the adhesive part PSA, and the cover member CW. Therefore, the buffer part DMP may increase the durability of the display panel 100 by cushioning an impact or stress applied on the display panel 100. The buffer part DMP may have a predetermined thickness (e.g., length in a thickness direction) sufficient to cushion the impactor stress of the display panel 100. The buffer part DMP may be a transparent film and may transmit light, which passes through the polarizing film POL, without modifying the light. In an embodiment, the buffer part DMP may include at least one compound selected from polyurethane, polyethylene, and polypropylene. However, embodiments of the present disclosure are not limited thereto.

As shown in FIG. 8, in an embodiment the buffer part DMP may include a pattern area MPA and a peripheral area MSA. In an embodiment, the pattern area MPA may be a central area of the buffer part DMP (e.g., in the X and Y directions), and the peripheral area MSA may be disposed around the pattern area MPA to surround the pattern area MPA (e.g., in the X and Y directions). The pattern area MPA of the buffer part DMP may overlap the touch sensor area TSA of the touch sensing unit TSU and the display area DA of the display unit DU (e.g., in a thickness direction). The peripheral area MSA of the buffer part DMP may overlap the touch peripheral area TA of the touch sensing unit TSU and the non-display area NDA of the display unit DU (e.g., in a thickness direction).

The metal pattern MP may be disposed on the buffer part DMP in the pattern area MPA. The metal pattern MP may have a single layer-mesh structure or net structure in plan view. In an embodiment, the minimum unit sides of the metal pattern MP may extend in first through fourth directions DR1 through DR4 to intersect each other. In the following description, the first direction DR1 may be a direction between the X direction and the Y direction, and the second direction DR2 may be a direction between the direction opposite to the X direction and the Y direction. The third direction DR3 may be a direction between the direction opposite to the X direction and a direction opposite to the Y direction, and the fourth direction DR4 may be a direction between the X direction and the direction opposite to the Y direction. In an embodiment, the metal pattern MP may include at least one compound selected from molybdenum (Mo), titanium (Ti), copper (Cu), aluminum (Al), gold (Au), silver (Ag), palladium (Pd), chromium (Cr), and indium tin oxide (ITO). The metal pattern MP may be formed on the buffer part DMP through a metal transfer process. However, embodiments of the present disclosure are not limited thereto.

The metal pattern MP may be electrically independent. For example, the metal pattern MP may be floating (e.g., electrically floated) by being electrically independent or may be grounded by being connected to the ground line.

The metal pattern MP may reduce scattering and absorption of visible light, infrared light, and ultraviolet light. Thus, the metal pattern MP may be identified using the visible light, the infrared light, or the ultraviolet light. For example, the metal pattern MP may be blackened to reduce reflection of external light and increase contrast ratio.

Figure 9:
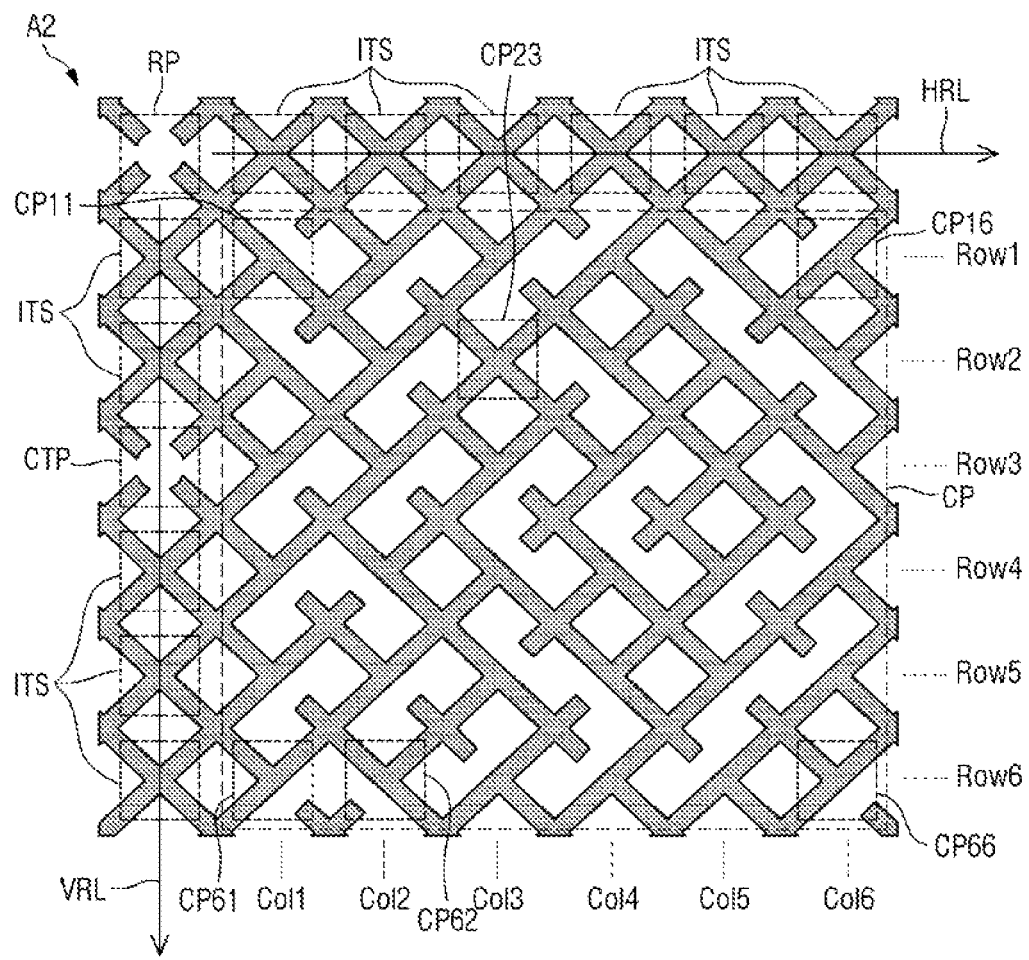
FIG. 9 is an enlarged view of area A2 of FIG. 8 according to an embodiment of the present disclosure.
Figure 9:
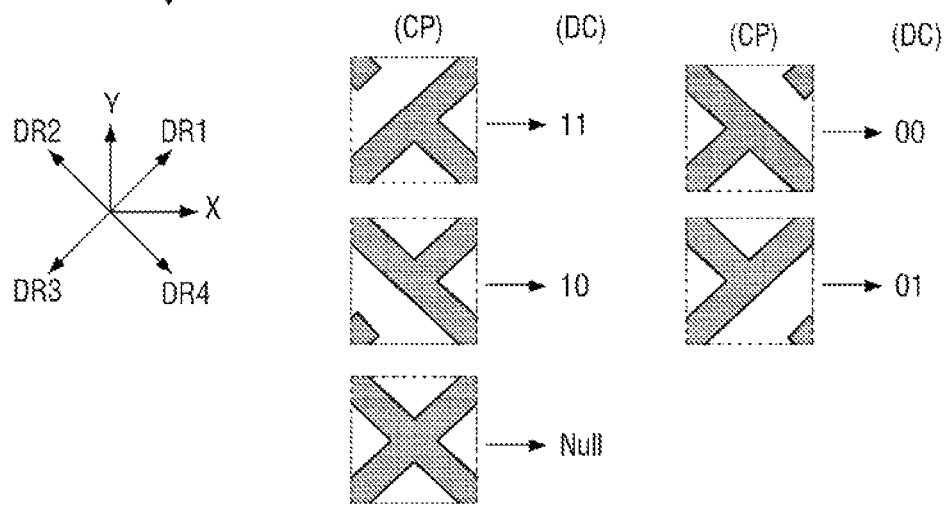

FIG. 9 is an enlarged view of area A2 of FIG. 8. FIG. 10 illustrates data codes DC corresponding to code patterns CP of FIG. 9. Here, the area A2 of FIG. 8 is not limited to the area shown but may be designed as needed within the pattern area MPA.

Referring to FIGS. 9 and 10, the metal pattern MP may include a reference point RP, a first reference line HRL, a second reference line VRL, and a plurality of code patterns CP.

The reference point RP may be a basis for identifying the code patterns CP. For example, the reference point RP may include an area in which an intersection point of the metal pattern CP is cut. For example, the metal pattern MP may be completely absent at an intersection point positioned at the reference point RP. For example, the reference point RP may be disposed at an intersection point of an extension to the first reference line HRL which extends in the X direction and an extension to the second reference line VRL which extends in the Y direction. However, embodiments of the present disclosure are not limited thereto. In an embodiment, the reference point RP may be adjacent to an upper left corner of the code patterns CP or an eleventh code pattern CP11.

The first reference line HRL may extend from the reference point RP in the X direction. The first reference line HRL may be defined by connecting a plurality of adjacent intersection points ITS arranged in the X direction of the reference point RP. In an embodiment, the intersection points ITS may be points in which the minimum unit sides of the metal pattern MP extending in the first through fourth directions DR1 to DR4 intersect each other. Portions of the minimum unit sides of the metal pattern MP extending longitudinally from an intersection point ITS may be referred to as a stem. For example, in an embodiment in which the first reference line HRL is defined by connecting six intersection points ITS adjacent to each other in the X direction, the code patterns CP may be arranged along six columns, each including six intersection points ITS. However, embodiments of the present disclosure are not limited thereto and the number of the intersection points ITS defining the first reference line HRL may vary.

The second reference line VRL may extend from the reference point RP in the direction opposite to the Y direction. The second reference line VRL may be defined by connecting a plurality of intersection points ITS disposed in the direction opposite to the Y direction of the reference point RP and a cut part CTP disposed between the intersection points ITS. The cut part CTP may be a portion of the metal pattern MP in which all of the stems of the metal pattern MP extending in the first through fourth directions DR1 through DR4 are not present and therefore do not intersect each other. For example, in an embodiment, the second reference line VRL may be defined by connecting two adjacent intersection points ITS, one cut part CTP and three adjacent intersection points ITS, and the code patterns CP may be arranged along six rows, each including five intersection points ITS and one cut part CTP. However, embodiments of the present disclosure are not limited thereto and the second reference line VRL may be defined by various numbers of plurality of adjacent intersection points ITS and/or cut parts.

The code patterns CP may be disposed in an area defined by the first reference line HRL and the second reference line VRL. A tilt or rotation angle of the code patterns CP with respect to a camera may be sensed using the first reference line HRL and the second reference line VRL. For example, in an embodiment in which the first reference line HRL is defined by connecting six intersection points ITS and the second reference line VRL is defined by connecting two adjacent intersection points ITS, one cut part CTP and three adjacent intersection points ITS, the code patterns CP may be arranged in a 6 by 6 (6×6) matrix. However, embodiments of the present disclosure are not limited thereto and the code patterns CP may be arranged in matrixes of various different sizes.

The code patterns CP may be portions of the metal pattern MP that are cut according to specific criteria to provide position information. For example, the code patterns CP may have a cut shape in a plan view that correspond to values of preset data codes DC. For example, each of the code patterns CP may have a cut shape that is provided by an absence of one of a plurality of stems extending from an intersection point of at least a portion of the metal pattern MP. However, embodiments of the present disclosure are not limited thereto. The cutting of one of the plurality of stems of the metal pattern MP may indicate that the metal pattern MP has a shape (e.g., a cut shape) in a plan view in which a stem is not included in at least one direction at an intersection point ITS. In an embodiment, the metal pattern MP may be pre-formed to not include the stem in the at least one direction at an intersection point ITS to provide a code pattern CP having a cut shape. However, embodiments of the present disclosure are not limited thereto. The stems of the at least a portion of the metal pattern MP may extend from the intersection point in the first through fourth directions DR1 through DR4, and one stem extending in one of the first through fourth directions DR1 through DR4 may be cut (e.g., may be at least partially absent, such as in a longitudinally extending direction) to provide the cut shape. The direction in which the one stem is cut may correspond to a value of a preset data code DC constituting the position information. However, embodiments of the present disclosure are not limited thereto and in some embodiments, two or more stems may be cut (e.g., at least partially absent, such as in a longitudinally extending direction) to provide a cut shape corresponding to a value of a preset data code DC. For example, in an embodiment, a code pattern CP disposed in an $m^{th}$ row in which m is a natural number and an $n^{th}$ column in which n is a natural number may correspond to a data code DC disposed in the $m^{th}$ row and the $n^{th}$ column.

For example, in an embodiment, a code pattern CP in which a stem in the first direction DR1 is cut may correspond to a data code DC of [00]. A code pattern CP in which a stem in the second direction DR2 is cut may correspond to a data code DC of [11]. A code pattern CP in which a stem in the third direction DR3 is cut may correspond to a data code DC of [10]. A code pattern CP in which a stem in the fourth direction DR4 is cut may correspond to a data code DC of [01]. However, embodiments of the present disclosure are not limited thereto and the code patterns CP may be arranged in various cut shapes to represent different data codes DC.

As shown in FIG. 9, in an embodiment, the eleventh code pattern CP11 disposed in a first row Row1 and a first column Col1 may have a stem in the first direction DR1 cut (e.g., at least partially absent), and an eleventh data code DC11 may have a value of [00]. A sixty-first code pattern CP61 disposed in a sixth row Row6 and the first column Col1 may have a stem in the fourth direction DR4 cut (e.g., at least partially absent), and a sixty-first data code DC61 may have a value of [01]. A sixty-second code pattern CP62 disposed in the sixth row Row6 and a second column Col2 may have a stem in the third direction DR3 cut (e.g., at least partially absent), and a sixty-second data code DC62 may have a value of [10]. A sixteenth code pattern CP16 disposed in the first row Row1 and a sixth column Col6 may have a stem in the second direction DR2 cut (e.g., at least partially absent), and a sixteenth data code DC16 may have a value of [11]. A sixty-sixth code pattern CP66 disposed in the sixth row Row6 and a sixth column Col6 may have a stem in the fourth direction DR4 cut (e.g., at least partially absent), and a sixty-sixth data code DC66 may have a value of [01].

In an embodiment, the code patterns CP may further include a conductive pattern in which none of the plurality of stems extending from an intersection point are cut (e.g., all of the plurality of stems are present). The conductive pattern might not have a value of a data code DC (null). Since the code patterns CP include the conductive pattern, electrical noise of the metal pattern MP can be prevented. For example, a twenty-third code pattern CP23 disposed in a second row Row2 and a third column Col3 may correspond to a conductive pattern, and a twenty-third data code DC23 might not have a value (null).

Since the display device 10 includes a plurality of code patterns CP provided in the metal pattern MP, it may receive a touch input of a touch input device such as a smart pen. The code patterns CP may have a cut shape according to specific criteria to provide (e.g., encode) position information by corresponding one-to-one to preset data codes DC. Therefore, the display device 10 may receive coordinate data generated using the data codes DC without determining position by complicated calculation and correction, thereby reducing cost, reducing power consumption, and simplifying a driving process. In addition, since the display device 10 includes the code patterns CP provided on the buffer part DMP, the display device 10 can be applied to all electronic devices without being limited by size. Since the metal pattern MP is formed as a single layer on the buffer part DMP, it can be bent, folded or rolled, and a manufacturing cost can be reduced. In an embodiment, the touch input device may photograph the code patterns CP disposed on the same layer and defined by the reference point RP, the first reference line HRL and the second reference line VRL. Therefore, the touch input device can reduce or prevent deterioration of image quality of a touch input system.

Figure 11:
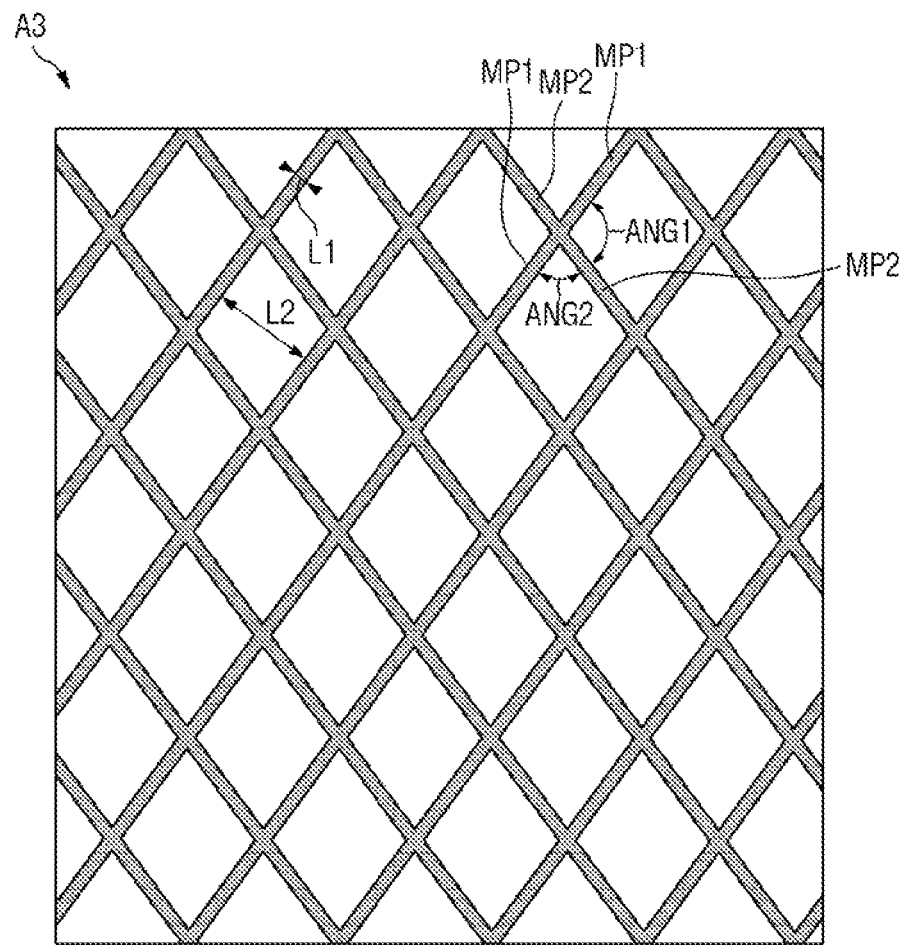
FIG. 11 is an enlarged view of area A3 of FIG. 8 according to an embodiment of the present disclosure.
Figure 11:
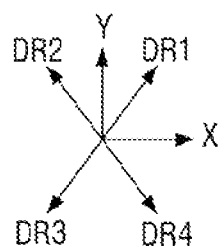

FIG. 11 is an enlarged view of area A3 of FIG. 8. Here, the area A3 of FIG. 8 is not limited to the area shown but may be designed as needed within the pattern area MPA.

Referring to FIG. 11, the mesh structure of the metal pattern MP may have a predetermined intersection angle. The intersection angle of the metal pattern MP may be designed to reduce or prevent the moire phenomenon. In an embodiment, the metal pattern MP may include a first metal pattern MP1 extending in the first direction DR1 and the third direction DR3 and a second metal pattern MP2 extending in the second direction DR2 and the fourth direction DR4. A first angle ANG1 and a second angle ANG2 between the first and second metal patterns MP1 and MP2 may be designed to reduce or prevent the moire phenomenon. For example, in an embodiment, the first angle ANG1 between the first and second metal patterns MP1 and MP2 may be greater than the second angle ANG2. Here, the second angle ANG2 may be adjacent to the first angle ANG1, and the sum of the first angle ANG1 and the second angle ANG2 may be 180 degrees. As the first angle ANG1 increases, the second angle ANG2 may decrease. Sizes of the first angle ANG1 and the second angle ANG2 may be adjusted or optimized to reduce or prevent the moire phenomenon. However, embodiments of the present disclosure are not limited thereto. For example, in an embodiment, the first angle ANG1 and the second angle ANG2 between the first and second metal patterns MP1 and MP2 may be substantially the same.

In an embodiment, a line width L1 of the metal pattern MP may be in a range of about 3 μm or less, and a pitch L2 of the metal pattern MP may be in a range of about 500 μm or less. However, embodiments of the present disclosure are not limited thereto. Since the line width L1 of the metal pattern MP is in a range of about 3 μm or less, the metal pattern MP might not be visible to the eyes of a user, and the moire phenomenon can be prevented. When the line width L1 of the metal pattern MP exceeds about 3 μm, the metal pattern MP may be visible to the user. Since the pitch L2 of the metal pattern MP is in a range of about 500 μm or less, the code patterns CP of the metal pattern MP may be easily identified by a camera of a touch input device. When the pitch L2 of the metal pattern MP exceeds about 500 μm, it may be difficult for the camera of the touch input device to easily photograph the code patterns CP. For example, the metal pattern MP might not overlap the first through third light-emitting areas EA1 through EA3 (e.g., in a thickness direction). The metal pattern MP may at least partially overlap the touch electrodes SEN (e.g., in a thickness direction). However, embodiments of the present disclosure are not limited thereto. For example, in an embodiment, the metal pattern MP may partially overlap each of the first through third light-emitting areas EA1 through EA3, but the overlap area may be minimized by adjusting the line width L1 and the pitch L2 of the metal pattern MP. Therefore, since the display device 10 includes the metal pattern MP having a relatively reduced line width L1 and a relatively increased pitch L2, visibility can be increased.

Figure 12:
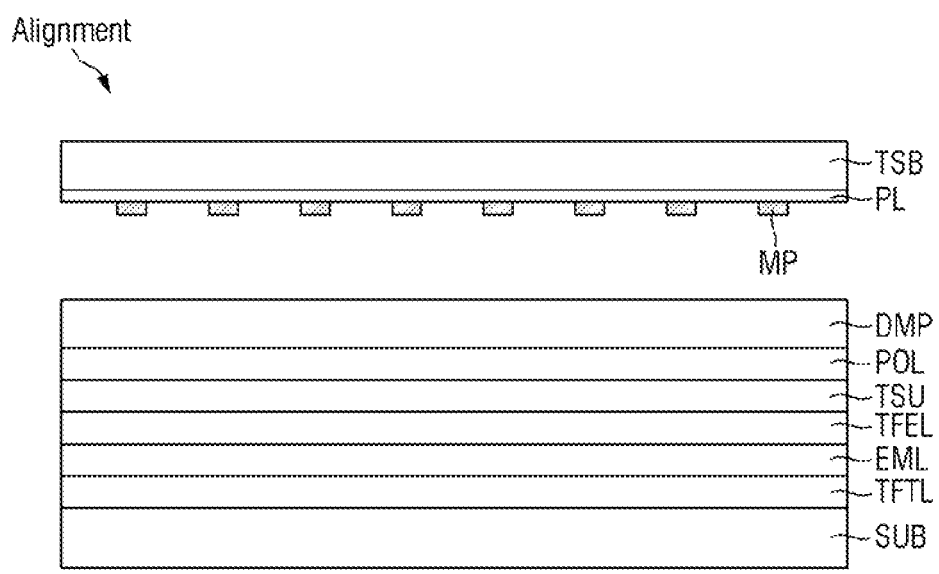
FIGS. 12 through 14 are cross-sectional views illustrating a process of forming a metal pattern in a display device according to embodiments of the present disclosure.
Figure 13:
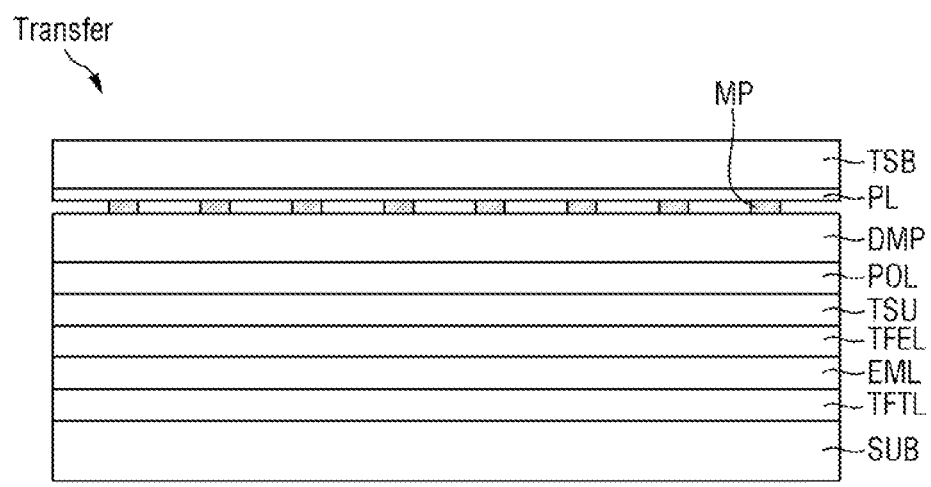
Figure 14:
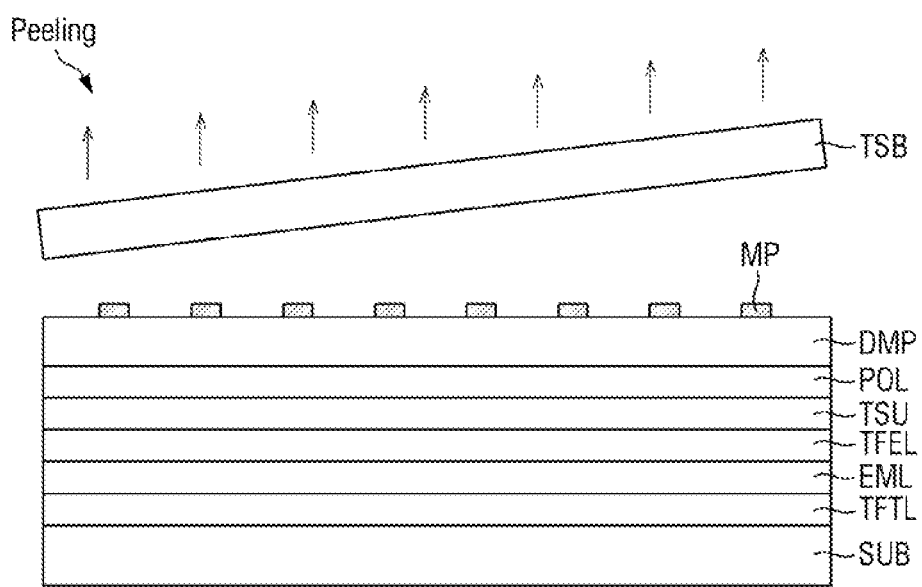

FIGS. 12 through 14 are views illustrating a process of forming a metal pattern MP in a display device 10 according to an embodiment of the present disclosure. The same elements as those described above will be briefly described and a repeated description of similar or identical elements may be omitted for convenience of explanation.

In FIG. 12, a substrate SUB may be a base substrate or a base member. The substrate SUB may support the display device 10 in the process of manufacturing the display device 10. A thin-film transistor layer TFT L, a light emitting element layer EML, an encapsulation layer TFEL, a touch sensing unit TSU, a polarizing film POL, and a buffer part DMP may be sequentially stacked on the substrate SUB.

A transfer substrate TSB may face the substrate SUB and may be spaced apart from the substrate SUB in a thickness direction with the thin-film transistor layer TFTL, light emitting element layer EML, encapsulation layer TFEL, touch sensing unit TSU, polarizing film POL, and buffer part DMP therebetween. In an embodiment, the transfer substrate TSB may include a glass material or a plastic material. However, embodiments of the present disclosure are not limited thereto. A peeling layer PL may be disposed on the transfer substrate TSB (e.g., disposed directly thereon in a thickness direction). The peeling layer PL may cover a surface of the transfer substrate TSB facing the substrate SUB. In an embodiment, the peeling layer PL may include at least one material selected from a silicone resin, polymer resin such as polyimide (PI), ultraviolet-curing resin, thermosetting resin, and thermoplastic resin. However, embodiments of the present disclosure are not limited thereto.

The metal pattern MP may be disposed on the peeling layer PL. The metal pattern MP may be disposed as a single layer on a surface of the peeling layer PL facing the substrate SUB. The metal pattern MP including a reference point RP, a first reference line HRL, a second reference line VRL, and a plurality of code patterns CP may be provided on the surface of the peeling layer PL.

The transfer substrate TSB may be aligned on the substrate SUB. The transfer substrate TSB may be aligned such that the metal pattern MP is disposed at an appropriate position on the substrate SUB in plan view. For example, in an embodiment, the transfer substrate TSB may be aligned on the substrate SUB using an alignment mask of the substrate SUB. However, embodiments of the present disclosure are not limited thereto.

In FIG. 13, the substrate SUB and the transfer substrate TSB may be bonded together. The metal pattern MP on the transfer substrate TSB may directly contact the buffer part DMP. The metal pattern MP may be transferred onto the buffer part DMP. For example, in an embodiment, the metal pattern MP may be seated on the buffer part DMP by performing a transfer process under a high-temperature or high-pressure condition.

In FIG. 14, the transfer substrate TSB may be peeled from the metal pattern MP by using the peeling layer PL. For example, in an embodiment, adhesion strength of the peeling layer PL may be weakened by ultraviolet light or heat, and the transfer substrate TSB may be removed from the metal pattern MP. Therefore, the metal pattern MP may be formed on a pattern area MPA of the buffer part DMP.

Figure 15:
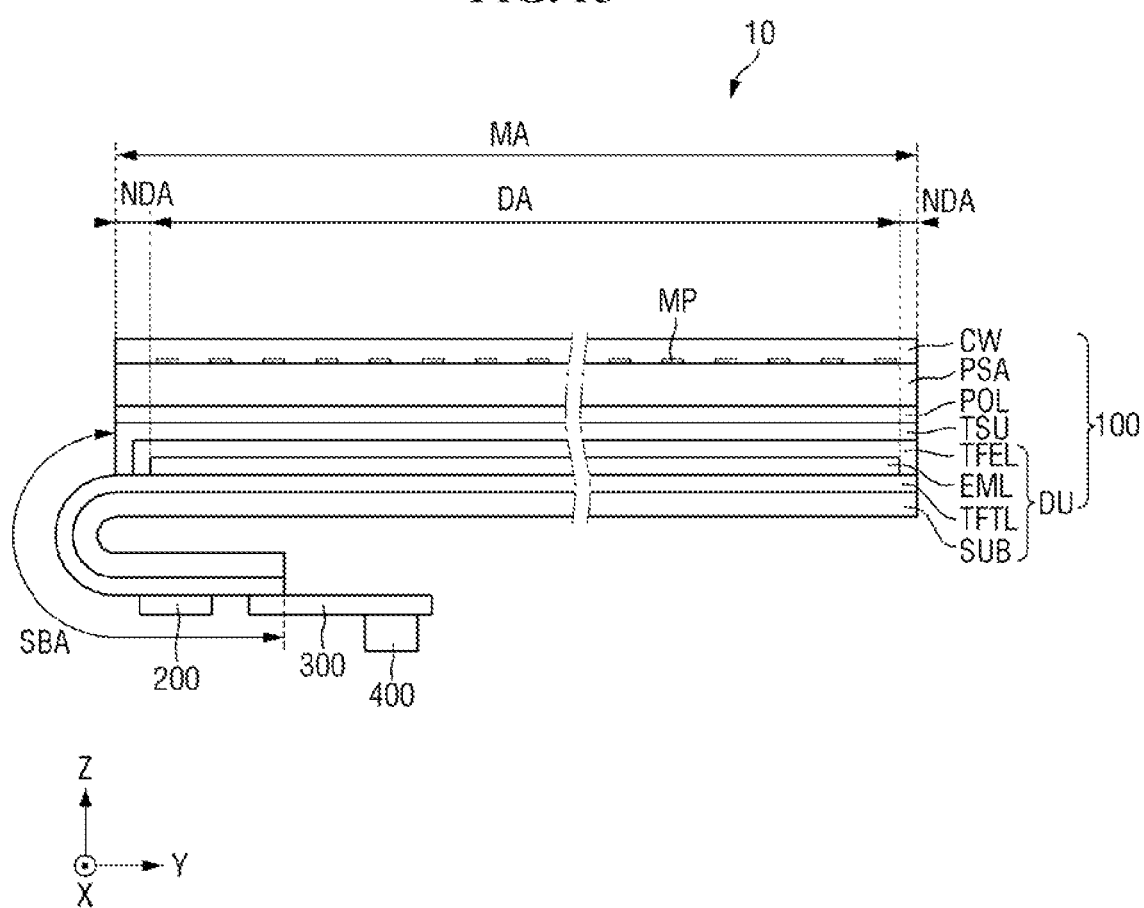
FIG. 15 is a cross-sectional view of a display device according to an embodiment of the present disclosure.

FIG. 15 is a cross-sectional view of a display device 10 according to an embodiment. The display device 10 of FIG. 15 is different from the display device 10 of FIG. 2 in a metal pattern MP. Therefore, the same elements as those described above will be briefly described and a repeated description of similar or identical elements may be omitted for convenience of explanation.

Referring to FIG. 15, a display panel 100 may include a display unit DU, a touch sensing unit TSU, a polarizing film POL, an adhesive part PSA, the metal pattern MP, and a cover member CW. The display unit DU may include a substrate SUB, a thin-film transistor layer TFTL, a light emitting element layer EML, and an encapsulation layer TFEL.

The adhesive part PSA may attach the cover member CW onto the polarizing film POL. In an embodiment, the adhesive part PSA may be a double-sided tape or an adhesive film having a high level of bonding and adhesive strength. For example, in an embodiment, the adhesive part PSA may include at least one material selected from a pressure sensitive adhesive, an optical clear adhesive, and an optical clear resin. However, embodiments of the present disclosure are not limited thereto. For example, a thickness of the adhesive part PSA of FIG. 15 may be greater than that of the adhesive part PSA of FIG. 2. The adhesive part PSA having a relatively large thickness may cushion the impact or stress of the display panel 100. In an embodiment, a modulus of the adhesive part PSA may be lower than a modulus of each of the display unit DU, the touch sensing unit TSU, the polarizing film POL, and the cover member CW. Therefore, the adhesive part PSA may increase the durability of the display panel 100.

The metal pattern MP may be disposed on the adhesive part PSA. In an embodiment, the metal pattern MP may have a single layer-mesh structure or net structure in plan view. Minimum unit sides of the metal pattern MP may extend in different directions to intersect each other. The mesh structure of the metal pattern MP may have a predetermined intersection angle. The intersection angle of the metal pattern MP may be designed to reduce or prevent the moire phenomenon. Since the display device 10 includes the metal pattern MP having a relatively reduced line width and a relatively increased pitch, visibility can be increased. In an embodiment, the metal pattern MP may include at least one compound selected from molybdenum (Mo), titanium (Ti), copper (Cu), aluminum (Al), gold (Au), silver (Ag), palladium (Pd), chromium (Cr), and indium tin oxide (ITO). However, embodiments of the present disclosure are not limited thereto. In an embodiment, the metal pattern MP may be formed on the adhesive part PSA through a metal transfer process. However, embodiments of the present disclosure are not limited thereto. Since the metal pattern MP is formed as a single layer on the adhesive part PSA, the metal pattern MP can be bent, folded or rolled, and a manufacturing cost can be reduced.

The metal pattern MP may be electrically independent. For example, the metal pattern MP may be floating (e.g., electrically floating) by being electrically independent or may be grounded by being connected to a ground line.

The metal pattern MP may minimize scattering and absorption of visible light, infrared light and ultraviolet light and thus may be identified using the visible light, the infrared light or the ultraviolet light. For example, the metal pattern MP may be blackened to reduce reflection of external light and increase contrast ratio. The metal pattern MP may include code patterns CP, and the code patterns CP of the metal pattern MP may be photographed by a camera of a touch input device. Therefore, the touch input device may identify the code patterns CP embedded in the metal pattern MP.

The cover member CW may be disposed on the metal pattern MP and the adhesive part PSA. The cover member CW may be attached onto the polarizing film POL by the adhesive part PSA. The cover member CW may protect an upper surface of the display panel 100. The cover member CW may include a transparent material to transmit light. For example, in an embodiment, the cover member CW may be a cover window, a cover glass, or a cover film. However, embodiments of the present disclosure are not limited thereto.

Figure 16:
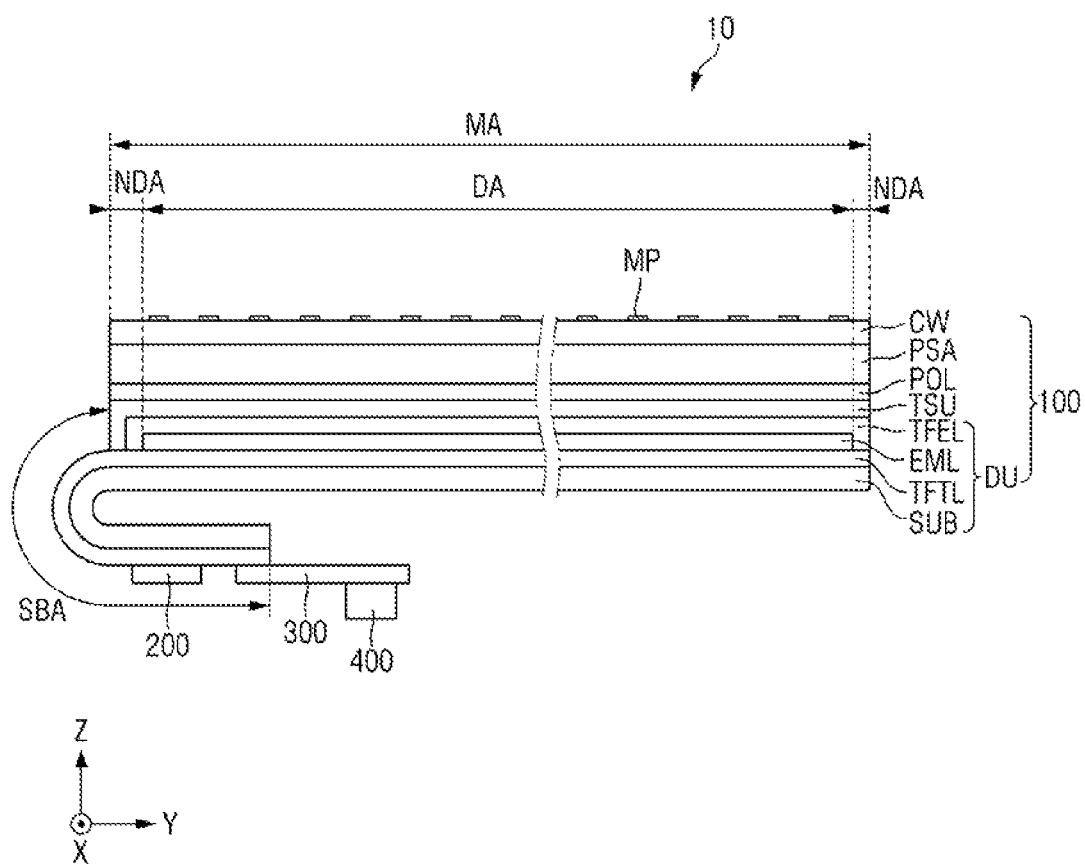
FIG. 16 is a cross-sectional view of a display device according to an embodiment of the present disclosure.

FIG. 16 is a cross-sectional view of a display device 10 according to an embodiment. The display device 10 of FIG. 16 is different from the display device 10 of FIG. 15 in a metal pattern MP. Therefore, the same elements as those described above will be briefly described or will not be described.

Referring to FIG. 16, a display panel 100 may include a display unit DU, a touch sensing unit TSU, a polarizing film POL, an adhesive part PSA, a cover member CW, and the metal pattern MP. The display unit DU may include a substrate SUB, a thin-film transistor layer TFTL, a light emitting element layer EML, and an encapsulation layer TFEL.

The adhesive part PSA may attach the cover member CW onto the polarizing film POL. In an embodiment, the adhesive part PSA may be a double-sided tape or an adhesive film having a high level of bonding and adhesive strength. For example, the adhesive part PSA may include at least one material selected from a pressure sensitive adhesive, an optical clear adhesive, and an optical clear resin. However, embodiments of the present disclosure are not limited thereto.

The cover member CW may be disposed on the adhesive part PSA. The cover member CW may be attached onto the polarizing film POL by the adhesive part PSA. The cover member CW may protect an upper surface of the display panel 100. The cover member CW may include a transparent material to transmit light. For example, a thickness of the cover member CW of FIG. 16 may be greater than that of the cover member CW of FIG. 15. The cover member CW having a relatively large thickness may cushion the impact or stress of the display panel 100 and increase the durability of the display panel 100. For example, in an embodiment, the cover member CW may be a cover window, a cover glass, or a cover film. However, embodiments of the present disclosure are not limited thereto.

The metal pattern MP may be disposed on the cover member CW. In an embodiment, the metal pattern MP may have a single layer-mesh structure or net structure in plan view. Minimum unit sides of the metal pattern MP may extend in different directions to intersect each other. The mesh structure of the metal pattern MP may have a predetermined intersection angle. The intersection angle of the metal pattern MP may be designed to reduce or prevent the moire phenomenon. Since the display device 10 includes the metal pattern MP having a relatively reduced line width and a relatively increased pitch, visibility can be increased. In an embodiment, the metal pattern MP may include at least one compound selected from molybdenum (Mo), titanium (Ti), copper (Cu), aluminum (Al), gold (Au), silver (Ag), palladium (Pd), chromium (Cr), and indium tin oxide (ITO). However, embodiments of the present disclosure are not limited thereto. In an embodiment, the metal pattern MP may be formed on the cover member CW through a metal transfer process. However, embodiments of the present disclosure are not limited thereto. Since the metal pattern MP is formed as a single layer on the cover member CW, the metal pattern MP can be bent, folded or rolled, and a manufacturing cost can be reduced.

The metal pattern MP may be electrically independent. For example, the metal pattern MP may be floating (e.g., electrically floated) by being electrically independent or may be grounded by being connected to a ground line.

The metal pattern MP may minimize scattering and absorption of visible light, infrared light and ultraviolet light and thus may be identified using the visible light, the infrared light or the ultraviolet light. For example, the metal pattern MP may be blackened to reduce reflection of external light and increase contrast ratio. The metal pattern MP may include code patterns CP, and the code patterns CP of the metal pattern MP may be photographed by a camera of a touch input device. Therefore, the touch input device may identify the code patterns CP embedded in the metal pattern MP.

Figure 17:
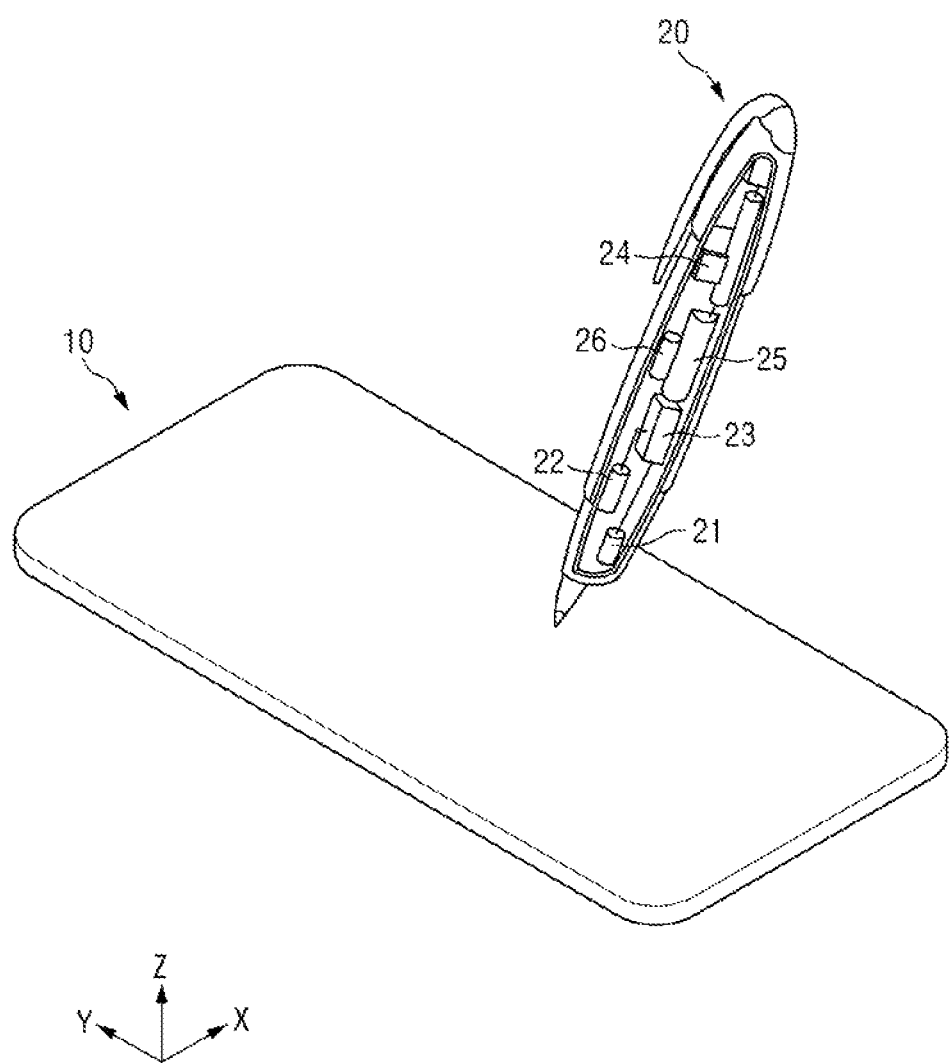
FIG. 17 is a perspective view of a touch input system according to an embodiment of the present disclosure.
Figure 18:
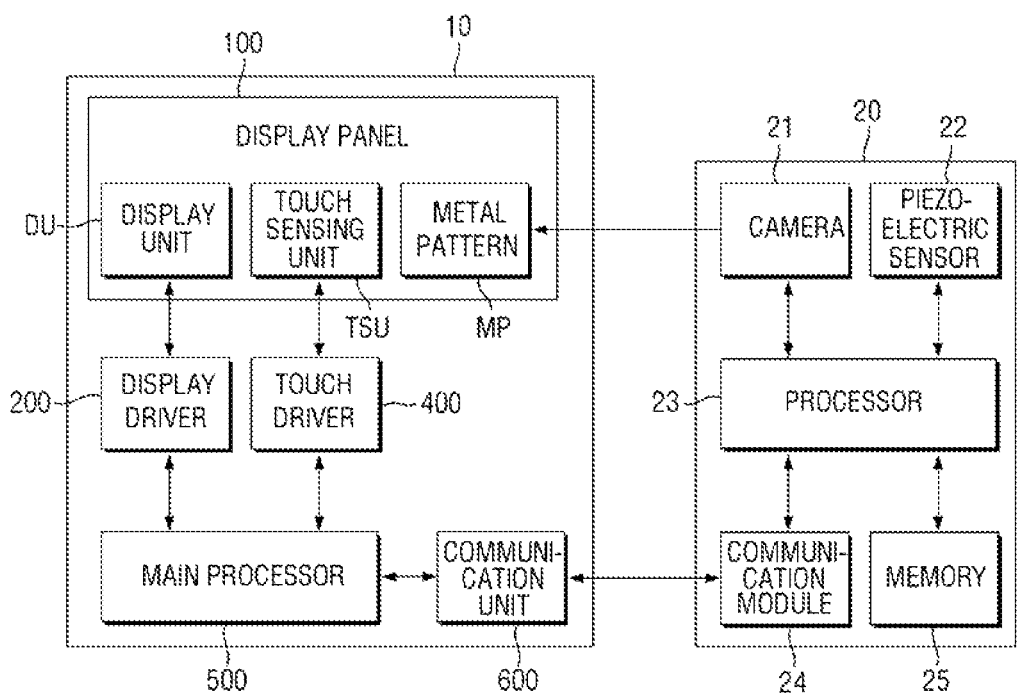
FIG. 18 is a block diagram of a display device and a touch input device in the touch input system according to an embodiment of the present disclosure.

FIG. 17 is a perspective view of a touch input system according to an embodiment of the present disclosure. FIG. 18 is a block diagram of a display device 10 and a touch input device 20 in the touch input system according to the embodiment of the present disclosure.

Referring to FIGS. 17 and 18, the touch input system may include the display device 10 and the touch input device 20.

The display device 10 may include a display panel 100, a display driver 200, a touch driver 400, a main processor 500, and a communication unit 600.

The display panel 100 may include a display unit DU and a touch sensing unit TSU. The display unit DU may include a plurality of pixels to display an image. The touch sensing unit TSU may include a plurality of touch electrodes SEN to sense a user's touch in a capacitive manner.

A metal pattern MP may include a plurality of code patterns CP that are cut according to specific criteria to provide position information. The code patterns CP may correspond to values of preset data codes DC. The metal pattern MP may be photographed by a camera 21 of the touch input device 20.

The display driver 200 may output signals and voltages for driving the display unit DU. The display driver 200 may supply data voltages to data lines DL. The display driver 200 may supply a power supply voltage to power lines VL and supply gate control signals to a gate driver 210.

The touch driver 400 may be connected to the touch sensing unit TSU. The touch driver 400 may supply a touch driving signal to the touch electrodes SEN of the touch sensing unit TSU and sense a change in capacitance between the touch electrodes SEN. The touch driver 400 may calculate whether a touch has been input and touch coordinates based on the change in capacitance between the touch electrodes SEN.

The main processor 500 may control all functions of the display device 10. For example, the main processor 500 may supply digital video data to the display driver 200 so that the display panel 100 displays an image. For example, the main processor 500 may receive touch data from the touch driver 400, determine touch coordinates of a user, and then generate digital video data according to the touch coordinates or execute an application indicated by an icon displayed at the touch coordinates of the user. However, embodiments of the present disclosure are not limited thereto. For example, in an embodiment, the main processor 500 may receive coordinate data from the touch input device 20, determine touch coordinates of the touch input device 20, and then generate digital video data according to the touch coordinates or execute an application indicated by an icon displayed at the touch coordinates of the touch input device 20.

The communication unit 600 may perform wired or wireless communication with an external device. For example, the communication unit 600 may transmit and receive communication signals to and from a communication module 24 of the touch input device 20. The communication unit 600 may receive coordinate data composed of data codes DC from the touch input device 20 and provide the coordinate data to the main processor 500.

The touch input device 20 may include the camera 21, a piezoelectric sensor 22, a processor 23, the communication module 24, a memory 25, and a battery 26. For example, in an embodiment, the touch input device 20 may be a smart pen, mouse or laser point that generates coordinate data using an optical method. However, embodiments of the present disclosure are not limited thereto.

The camera 21 may be disposed at the front of the touch input device 20. The camera 21 may photograph the metal pattern MP of the display panel 100 and identify the code patterns CP embedded in the metal pattern MP. For example, the code patterns CP may be defined by a reference point RP, a first reference line HRL and a second reference line VRL. However, embodiments of the present disclosure are not limited thereto. The camera 21 may continuously photograph the metal pattern MP at a corresponding position according to the movement of the touch input device 20. The camera 21 may provide a captured image to the processor 23.

The piezoelectric sensor 22 may sense the pressure applied to the display device 10 by the touch input device 20. The piezoelectric sensor 22 may provide pressure information of the touch input device 20 to the processor 23.

The processor 23 may receive an image of the metal pattern MP from the camera 21. For example, the processor 23 may receive an image of the metal pattern M P illustrated in FIG. 9 and identify the code patterns CP based on the positions of the first reference line HRL and the second reference line VRL. The processor 23 may convert the code patterns CP into corresponding data codes DC and generate coordinate data by combining the data codes DC. The processor 23 may transmit the generated coordinate data to the display device 10 through the communication module 24.

Since the processor 23 receives an image of the metal pattern MP and converts the code patterns CP into data codes DC corresponding one-to-one to the code patterns CP, it can rapidly generate coordinate data without performing complicated calculation and correction. Therefore, the touch input system can reduce cost, reduce power consumption, and simplify a driving process. In addition, since the touch input system includes the code patterns CP embedded in the metal pattern MP of a single layer, it can be applied to all electronic devices without being limited by size. Since the metal pattern MP is formed as a single layer, the metal pattern MP can be bent, folded or rolled, and a manufacturing cost can be reduced. The touch input device 20 can decrease or prevent the deterioration of image quality of the touch input system by photographing the code patterns CP.

The communication module 24 may perform wired or wireless communication with an external device. For example, the communication module 24 may transmit and receive communication signals to and from the communication unit 600 of the display device 10. The communication module 24 may receive coordinate data composed of data codes DC from the processor 23 and provide the coordinate data to the communication unit 600.

The memory 25 may store data needed to drive the touch input device 20. The touch input device 20 may convert the code patterns CP into data codes DC corresponding one-to-one to the code patterns CP and provide coordinate data to the display device 10. Therefore, the memory 25 with a relatively small capacity may be included.

According to a display device and a touch input system including the same according to embodiments, the display device can receive a touch input of a touch input device such as a smart pen by including a metal pattern having a plurality of code patterns disposed on a buffer part, an adhesive part or a cover member. The code patterns may be cut according to specific criteria to provide position information and may correspond one-to-one to preset data codes. Therefore, the display device and the touch input system including the same can reduce cost, reduce power consumption, and simplify a driving process by generating coordinate data composed of the data codes without performing complicated calculation and correction. In addition, the display device and the touch input system including the same can be applied to all electronic devices having a touch function without being limited by size by including the code patterns provided in the metal pattern and can decrease or prevent deterioration of image quality.

However, the effects of the present disclosure are not restricted to the one set forth herein and the present disclosure is not limited to the described embodiments.

What is claimed is:

1. A display device comprising:
    a display unit comprising a plurality of light-emitting areas emitting light;
    a touch sensing unit disposed on the display unit to sense a touch;
    a buffer part disposed on the touch sensing unit to cushion an external impact; and
    a metal pattern disposed on the buffer part, the metal pattern having a mesh structure,
    wherein the metal pattern comprises a plurality of code patterns, each of the plurality of code patterns having a cut shape that encodes position information.

2. The display device of claim 1, wherein the metal pattern is floating by being electrically independent.

3. The display device of claim 1, wherein the metal pattern reduces scattering and absorption of visible light, infrared light and ultraviolet light and is identifiable using the visible light, the infrared light or the ultraviolet light.

4. The display device of claim 1, wherein the metal pattern is blackened to reduce reflection of external light.

5. The display device of claim 1, wherein a line width of the metal pattern is in a range of about 3 μm or less, and a pitch of the metal pattern is in a range of about 500 μm or less.

6. The display device of claim 1, wherein:
    the metal pattern comprises a first metal pattern extending in a first direction and a second metal pattern intersecting the first metal pattern, the first and second metal patterns having first and second angles therebetween, the first and second angles are adjacent to each other, wherein the first angle is greater than the second angle.

7. The display device of claim 1, wherein the metal pattern comprises a single layer disposed on the buffer part.

8. The display device of claim 1, wherein the metal pattern further comprises:
    a reference point serving as a basis for identification of the plurality of code patterns;
    a first reference line extending from the reference point in a first direction; and
    a second reference line extending from the reference point in a second direction intersecting the first direction; and
    the plurality of code patterns are disposed in an area defined by the first reference line and the second reference line.

9. The display device of claim 8, wherein the reference point comprises an area in which the metal pattern is absent at an intersection point of the metal pattern.

10. The display device of claim 8, wherein the first reference line is defined by connecting a plurality of adjacent intersection points disposed in the first direction of the reference point.

11. The display device of claim 8, wherein the second reference line is defined by connecting at least one plurality of adjacent intersection points disposed in the second direction of the reference point and at least one cut part disposed between the at least one adjacent intersection points.

12. The display device of claim 8, wherein:
    each of the plurality of code patterns is provided by an absence of one stem among a plurality of stems extending from an intersection point of the metal pattern; and
    a direction in which the one stem is absent corresponds to a value of a preset data code constituting the position information.

13. The display device of claim 8, wherein:
    the metal pattern comprises a first metal pattern and a second metal pattern intersecting each other in first to fourth directions;
    a first code pattern of the plurality of code patterns comprise a conductive pattern having a plurality of stems extending from an intersection point between the first and second metal patterns, the plurality of stems extend in the first to fourth directions in the first code pattern, and
    the first code pattern encodes a null value.

14. The display device of claim 1, wherein a modulus of the buffer part is lower than a modulus of each of the display unit and the touch sensing unit.

* * * * *